(12) United States Patent
Kusunoki et al.

(10) Patent No.: US 6,483,133 B2
(45) Date of Patent: Nov. 19, 2002

(54) EEPROM WITH HIGH CHANNEL HOT CARRIER INJECTION EFFICIENCY

(75) Inventors: Shigeru Kusunoki, Hyogo (JP); Hidekazu Oda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/022,337

(22) Filed: Dec. 20, 2001

(65) Prior Publication Data

US 2002/0066934 A1 Jun. 6, 2002

Related U.S. Application Data

(63) Continuation of application No. 08/622,327, filed on Mar. 26, 1996, now Pat. No. 6,335,549, which is a continuation of application No. 08/283,863, filed on Aug. 1, 1994, now abandoned.

(30) Foreign Application Priority Data

Nov. 2, 1993 (JP) .............................................. 5-274695

(51) Int. Cl.[7] .............................................. H01L 27/148
(52) U.S. Cl. ........................ 257/231; 257/231; 257/327
(58) Field of Search .................................. 257/231, 321, 257/315, 411, 336; 436/48, 263, 264, 596, 201, 211, 257, 216, 261, 287, 591, 954, 981

(56) References Cited

U.S. PATENT DOCUMENTS

| 4,597,824 A | 7/1986 | Shinada et al. ............. 257/336 |
| 4,868,619 A | 9/1989 | Mukherjee et al. .......... 257/300 |
| 5,060,195 A | * 10/1991 | Gill et al. ...................... 257/59 |

(List continued on next page.)

FOREIGN PATENT DOCUMENTS

| JP | 62-500625 | 3/1987 | |
| JP | 1-257366 | 10/1989 | ................. 257/411 |
| JP | 2-114568 | 4/1990 | |
| JP | 2-265279 | 10/1990 | ................. 257/411 |
| JP | 4-278587 | 10/1992 | |
| JP | 5-211330 | 8/1993 | |

OTHER PUBLICATIONS

"An AS–P(N+–N) Double Diffused Drain MOSFET VLSIS", Takeda et al, 1982, Symposium on VLSI Technology Digest of Technical Papers, pp. 40–41.

"Hot–Carrier–Resistant Structure By Re–Oxide Gate MOSFETS For Deep–Sub–Micron CMOS Devices", Sasaki et al, IEDM 1991, pp. 649–652.

"Very Lightly Nitrided Oxide Gate MOSFETSS For Deep–Sub–Micron CMOS Devices", Sasaki et al, IEDM 1991, pp. 359–362.

"Demands for Submicron Mosfets and Nitrided Oxide Gate–Dielectrics", Extended Abstracts of the 21st Conference on Solid State Devices and Materials, Hori, pp. 197–200.

"Vertically Scaled, High Reliability EEPROM Devices With Ultra–Thin Oxynitride Films Prepared By RTP In $N_2O/O_2$ Ambient", Umesh Sharma et al, IEDM 1992, pp. 461–464.

(List continued on next page.)

Primary Examiner—Jasmine J B Clark
(74) Attorney, Agent, or Firm—McDermott, Will & Emery

(57) ABSTRACT

A semiconductor memory device and a method of manufacturing the same improves an efficiency of injection of channel hot electrons while suppressing injection of drain avalanche hot carriers. In the semiconductor memory device, a first nitrided oxide film (RNO film) containing a first content of hydrogen is formed at a drain avalanche hot carrier injection region. Thereby, injection of drain avalanche hot carriers is effectively suppressed during a data writing operation. A second nitrided oxide film (NO film) containing a second content of hydrogen larger than the first content is formed at a channel hot electron injection region. Thereby, an efficiency of injection of channel hot electrons is improved during the data writing operation.

3 Claims, 36 Drawing Sheets

U.S. PATENT DOCUMENTS

| | | | |
|---|---|---|---|
| 5,063,423 A | | 11/1991 | Fuji et al. .................... 257/321 |
| 5,229,311 A | * | 7/1993 | Lai et al. ..................... 438/143 |
| 5,293,328 A | | 3/1994 | Amin et al. ................. 257/315 |
| 5,300,802 A | | 4/1994 | Komori et al. ............. 257/321 |
| 5,338,952 A | | 8/1994 | Yamauchi ................... 257/315 |
| 5,369,297 A | | 11/1994 | Kusunoki et al. ........... 257/411 |
| 5,403,786 A | | 4/1995 | Hori ........................... 437/238 |
| 5,500,816 A | | 3/1996 | Kobayashi |

OTHER PUBLICATIONS

"High–Performance Scaled Flash–Type EEPROMS With Heavily Oxynitrided Tunnel Oxide Films", Fukuda et al, IEDM 1992, pp. 465–468.

"Hot Carrier Related Phenomena For N—And P–Mosfets With Nitrided Gate Oxide By RTP", Sasaki et al, IEDM 1989, pp. 267–270.

* cited by examiner

150 : DRAIN AVALANCHE HOT CARRIER INJECTION REGION
160 : CHANNEL HOT ELECTRON (HOLE) INJECTION REGION

EEPROM WITH HIGH CHANNEL HOT CARRIER INJECTION EFFICIENCY

This application is a continuation of application Ser. No. 08/622,327 filed Mar. 26, 1996 now U.S. Pat. No. 6,335,549, which is a Rule 62 Continuation of application Ser. No. 08/283,863, filed Aug. 1, 1994, abandoned.

BACKGROUND OF THE INVENTION

1. Field of the Invention

The present invention relates to a semiconductor memory device and a method of manufacturing the same, and in particular, to a semiconductor memory device allowing electrical writing and erasing of information as well as a method of manufacturing the same.

2. Description of the Background Art

As one of nonvolatile semiconductor memory devices, there has been known an EEPROM (Electrically Erasable and Programmable Read Only Memory) in which data can be freely programmed and which allows electrical writing and erasing of information. Although the EEPROM has an advantage that both writing and erasing can be executed electrically, it disadvantageously requires two transistors for each memory cell, and therefore integration to a higher degree is difficult. For this reason, there has been proposed a flash EEPROM including memory cells, each of which is formed of one transistor, and allowing electrical entire chip erasing of written electric information charges, for example, in U.S. Pat. No. 4,868,619.

FIG. 53 is a block diagram showing a general structure of a flash EEPROM in the prior art. Referring to FIG. 53, the flash EEPROM includes a memory cell matrix 100, an X-address decoder 200, a Y-gate sense amplifier 300, a Y-address decoder 400, an address buffer 500, an I/O (input/output) buffer 600 and a control logic 700.

The memory cell matrix 100 includes a plurality of memory cells arranged in rows and columns. The X-address decoder 200 and Y-gate sense amplifier 300 are connected to the memory cell matrix 100 for selecting the rows and columns thereof. The Y-address decoder 400 is connected to the Y-gate sense amplifier 300 for applying selection information of column thereto. The address buffer 500 is connected to the X-address decoder 200 and Y-address decoder 400, and temporarily stores the address information.

The Y-gate sense amplifier 300 is connected to the I/O buffer 600 for temporarily storing I/O data. The control logic 700 is connected to the address buffer 500 and I/O buffer 600 for controlling an operation of the flash EEPROM. The control logic 700 carries out the control based on a chip enable signal (/CE), an output enable signal (/OE) and a program signal (/PGM).

FIG. 54 is an equivalent circuit diagram showing a schematic structure of the memory cell matrix 100 shown in FIG. 53. Referring to FIG. 54, the memory cell matrix 100 includes a plurality of word lines $WL_1$, $WL_2$, ..., $WL_1$ extending in a row direction and a plurality of bit lines $BL_1$, $BL_2$, ..., $BL_1$ extending in a column direction and perpendicularly crossing the word lines. At crossings of the word lines and bit lines, there are disposed memory transistors $Q_{11}$, $Q_{12}$, ..., $Q_{11}$ each having a floating gate electrode, respectively. Each memory transistor has a drain connected to the corresponding bit line, and a control gate electrode connected to the corresponding word line. A source of each memory transistor is connected to corresponding one of the source lines $SL_1$, $SL_2$, ..., $SL_1$, which are connected to source lines $S_1$ and $S_2$ disposed at opposite sides.

FIG. 55 is a schematic plan showing a flash EEPROM of a stack gate type in the prior art. FIG. 56 is a cross section taken along line A—A in FIG. 55. Referring to FIGS. 55 and 56, a structure of the flash EEPROM in the prior art will be described below.

Referring to FIG. 55, control gate electrodes 137 are mutually connected to form word lines extending in a lateral direction (row direction). Bit lines 139 extend perpendicularly to the word lines 137. Each bit line 139 connects drain diffusion regions 132, which are aligned in a longitudinal direction (column direction), to each other. The bit lines 139 are electrically connected to the drain diffusion regions 132 through drain contacts 140. Referring to FIG. 56, the bit line 139 extends over a smooth coat film 141. Referring to FIG. 55 again, source diffusion regions 133 extend along the word lines 137 and are formed in regions surrounded by the word lines 137 and element isolating oxide films 130. Each drain diffusion region 132 is formed in a region surrounded by the word line 137 and element isolating oxide film 130.

Referring to FIG. 56, at a main surface of a P-type silicon substrate 131, there are formed the drain diffusion regions 132 and source diffusion regions 133 at opposite sides of channel regions with predetermined spaces between each other. On the channel regions, there are formed floating gate electrodes 135 with a thin oxide film 134 of about 100 Å in thickness therebetween. The control gate 137 is formed on each floating gate electrode 135 with an interlayer insulating film 136 therebetween for electrically isolating them from each other. The floating gate electrode 135 and control gate electrode 137 are formed of polysilicon layers. A thermal oxide film 138 is formed by thermal oxidation of surfaces of the P-type silicon substrate 131 as well as floating gate electrode 135 and control gate electrode 137 made of polysilicon layers. The floating gate electrode 135 and control gate electrode 137 are covered with the smooth coat film 141 formed of an oxide film or the like.

An operation of the flash EEPROM will be described below with reference to FIG. 56.

In a writing operation, a voltage $V_{D1}$ of about 6 to 8V is applied to the drain diffusion region 132, and a voltage $V_{G1}$ of about 10 to 15V is applied to the control gate electrode 137. Thereby, electrons (holes) are accelerated by an electric field near the drain diffusion region 132 and obtain a high energy. The channel hot electrons (holes) which have obtained the high energy are attracted and injected into the floating gate electrode 135 by the electric field which is caused by the voltage $V_{G1}$ applied to the control gate electrode 137. This is called channel hot electron (hole) injection. The channel hot electrons having the high energy impinge against lattices of silicon to generate electron hole pairs. The electrons (holes) thus generated are attracted and injected into the floating gate electrode 135 by the electric field which is caused by the voltage $V_{G1}$ applied to the control gate electrode 137. This is called drain avalanche hot carrier injection. If electrons are accumulated in the floating gate electrode 135 by the channel hot electron injection and drain avalanche hot carrier injection, a threshold voltage $V_{th}$ of the control gate transistor increases. The state where the threshold voltage $V_{th}$ is higher than a predetermined value is a programmed state and is also referred to as a state of "0".

In an erasing operation, a voltage $V_s$ of about 10 to 12V is applied to the source diffusion region 133. The control gate electrode 137 is maintained at the ground voltage, and the drain diffusion region 133 is maintained at the floating state. The electric field generated by the voltage $V_s$ applied to the source diffusion region 133 causes the electrons in the floating gate electrode 135 to pass through the thin oxide film 134 by virtue of an F-N (Fowler-Nordheim) tunneling phenomenon. Owing to the removal of electrons in the floating gate electrode 135 in this manner, the threshold voltage $V_{th}$ of the control gate transistor decreases. This state where the threshold voltage $V_{th}$ is lower than the predetermined value is an erased state, and is also referred to as a state of "1". Since the sources of transistors are mutually connected as shown in FIG. 55, entire chip erasing of all the memory cells is carried out by this erasing operation.

In reading operation, a voltage $V_{G2}$ of about 5V is applied to the control gate electrode 137, and a voltage $V_{D2}$ of about 1 to 2V is applied to the drain diffusion region 132. In this operation, the determination of "1" or "0" described above is carried out based on whether a current flows through the channel region of the control gate transistor or not, i.e., whether the control gate transistor is in the on-state or off-state. Thereby, information is read.

FIG. 57 is a cross section specifically showing the writing operation of the conventional flash EEPROM. Referring to FIG. 57, the writing operation will be described in greater detail. Both the channel hot electrons (holes) and drain avalanche hot carriers are generated near the drain diffusion region 132. More specifically, the position where the channel hot electrons (holes) are generated is nearer to the source diffusion region 133 than the position where the drain avalanche hot carriers are generated. Therefore, a drain avalanche hot carrier injection region 150 and a channel hot electron (hole) injection region 160 are positioned as shown in FIG. 57. The gate voltage at the time of generation of the channel hot electrons (holes) is larger than the gate voltage at the time of generation of the drain avalanche hot carriers. This is disclosed, for example, in 1982 *Symposium on VLSI Technology Digest of Technical Papers*, pp. 40–41. FIG. 58 shows correlation between the gate voltage and the gate current corresponding to three different values of the drain voltage $V_D$ disclosed in the above reference. As can be seen from FIG. 58, the drain avalanche hot carrier injection is carried out when the gate voltage is low, and the channel hot electron injection is carried out when the gate voltage is high.

FIGS. 59–61 are cross sections showing a process of manufacturing the conventional flash EEPROM shown in FIG. 57. Referring to FIGS. 59–61, the process of manufacturing the conventional flash EEPROM will be described below.

As shown in FIG. 59, a silicon oxide film 134 of about 10 nm in thickness is formed on the surface of the P-type semiconductor substrate 131.

Then, as shown in FIG. 60, a polysilicon film 135, which has a thickness of about 50 to 100 nm and contains impurity introduced thereinto, is formed on the silicon oxide film 134. An interlayer insulating film 136 is formed on the polysilicon film 135. A polysilicon film 137, which has a thickness of about 100 to 200 nm and contains impurity introduced thereinto, is formed on the interlayer insulating film 136. A photoresist 138 is formed at a predetermined region on the polysilicon film 137.

Thereafter, anisotropic etching is effected on the polysilicon film 137, interlayer insulating film 136, polysilicon film 135 and silicon oxide film 134, using the photoresist 138 as a mask. Thereby, the silicon oxide film 134, floating gate electrode 135, interlayer insulating film 136 and control gate electrode 137 are formed as shown in FIG. 61. Thereafter, the photoresist 138 is removed.

Finally, as shown in FIG. 57, N-type impurity is ion-implanted into the P-type semiconductor substrate 131 using the control gate electrode 137 as a mask, whereby the source diffusion region 133 and drain diffusion region 132 are completed.

In the conventional flash EEPROM, the silicon oxide film 134 forms the insulating film under the floating gate electrode 135, so that efficiency of injection of channel hot electrons is low. In the conventional flash EEPROM, electrons injected into the floating gate electrode 135 by the channel hot electron (hole) injection account for 90% of all the electrons injected into the floating gate electrode 135. Therefore, if the efficiency of injection of channel hot electrons decreases, the writing efficiency also decreases remarkably. If the writing efficiency decreases, the speed of writing information also decreases, resulting in difficulty in increasing the speed of the device.

In order to improve the above low efficiency of injection of channel hot electrons, high gate and drain voltages may be applied. However, high gate and drain voltages may deteriorate the breakdown voltage and the reliability of a peripheral circuitry which drives a high voltage when elements are miniaturized to a higher extent.

Further, miniaturization of element causes a disadvantage that injection of drain avalanche hot carriers is liable to generate an interface level. More specifically, the drain avalanche hot carrier has less energy than the channel hot electron. Therefore, the hot carriers injected by the drain avalanche hot carrier injection are liable to stop at the interface between the silicon oxide film 134 and the semiconductor substrate 131 without reaching the floating gate electrode 135. For this reason, the drain avalanche hot carrier injection is liable to cause the interface level. Here, "interface level" means the energy level at the $Si/SiO_2$ interface region allowing transmission of electric charges to and from the silicon substrate. Generation of such an interface level may cause disadvantages such as variation of the threshold voltage of memory transistors.

In the prior art, as described above, since the efficiency of implantation of channel hot electrons is low, the gate and drain voltages must be high, resulting in disadvantages such as deterioration of the breakdown voltage of the peripheral circuitry driving a high voltage. Further, in accordance with miniaturization of elements, it becomes more likely that the interface level is disadvantageously generated by the drain avalanche hot carrier injection.

SUMMARY OF THE INVENTION

An object of the invention is to provide a semiconductor memory device which improves an efficiency of injection of channel hot electrons and suppresses generation of an interface level, which may be caused by drain avalanche hot carrier injection.

Another object of the invention is to provide a semiconductor memory device which suppresses an interface level, which may be caused by drain avalanche hot carrier injection.

Still another object of the invention is to provide a method of manufacturing a semiconductor memory device, which enables easy manufacturing of a semiconductor memory device having a high efficiency of injection of channel hot electrons and capable of suppressing generation of an interface level which may be caused by injection of drain avalanche hot carriers.

According to an aspect of the invention, a semiconductor memory device includes a semiconductor substrate, source and drain regions, a first nitrided oxide film, a second nitrided oxide film, and a gate electrode. The source and drain regions are formed on a main surface of the semiconductor substrate with a predetermined space between each other and are located at opposite sides of a channel region. The first nitrided oxide film is formed at a drain avalanche hot carrier injection region on the main surface of the semiconductor substrate, and contains a first content of hydrogen. The second nitrided oxide film is formed at a channel hot carrier injection region on the main surface of the semiconductor substrate, and contains a second content of hydrogen larger than the first content. The gate electrode is formed on the channel region. Preferably, each of the first and second nitrided oxide film contains nitrogen at $2.5 \times 10^{20}/cm^3$ or more, the first content is less than $3 \times 10^{20}/cm^3$, and the second content is $3 \times 10^{20}/cm^3$ or more.

In the semiconductor memory device according to this aspect of the invention, the first nitrided oxide film containing the first content of hydrogen is formed at the drain avalanche hot carrier injection region, so that the first nitrided oxide film suppresses injection of the drain avalanche hot carriers. At the same time, the second nitrided oxide film containing the second content of hydrogen larger than the first content is formed at the channel hot carrier injection region, so that the second nitrided oxide film improves the efficiency of injection of the channel hot carriers. Consequently, the write efficiency can be improved without increasing the gate and drain voltages in contrast to the prior art.

A semiconductor memory device according to another aspect of the invention includes a semiconductor substrate, source and drain regions, a nitrided oxide film and a gate electrode. The nitrided oxide film is formed at least at a drain avalanche hot carrier injection region on a main surface of the semiconductor substrate, and contains nitrogen of $2.5 \times 10^{20}/cm^3$ or more and hydrogen of less than $3 \times 10^{20}/cm^3$.

In this semiconductor substrate, since the nitrided oxide film which contains nitrogen of $2.5 \times 10^{20}/cm^3$ or more and hydrogen of less than $3 \times 10^{20}/cm^3$ is formed at the drain avalanche hot carrier injection region, the nitrided oxide film suppresses injection of drain avalanche hot carriers. Thereby, generation of an interface level caused by the injection of drain avalanche hot carriers can be suppressed more effectively even if elements are miniaturized to a higher extent.

A method of manufacturing a semiconductor substrate according to an aspect of the invention includes the step of forming a source region and a drain region which are provided on a main surface of a semiconductor substrate with a predetermined space between each other and are located at opposite sides of a channel region. The method also includes the step of forming a first nitrided oxide film, which contains a first content of hydrogen, at a drain avalanche hot carrier injection region on the main surface of the semiconductor substrate. The method further includes the step of forming a second nitrided oxide film, which contains a second content of hydrogen larger than the first content, at a channel hot carrier injection region on the main surface of the semiconductor substrate. The method also includes the step of forming a gate electrode on the channel region.

In this method of manufacturing the semiconductor memory device, the first nitrided oxide film, which includes the first content of hydrogen, is formed at the drain avalanche hot carrier injection region on the main surface of the semiconductor substrate. The second nitrided oxide film, which contains the second content of hydrogen larger than the first content, is formed at the channel hot carrier injection region on the main surface of the semiconductor substrate. Therefore, the method enables easy manufacturing of the semiconductor memory device which can improve an efficiency of injection of the channel hot carriers while suppressing injection of the drain avalanche hot carriers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
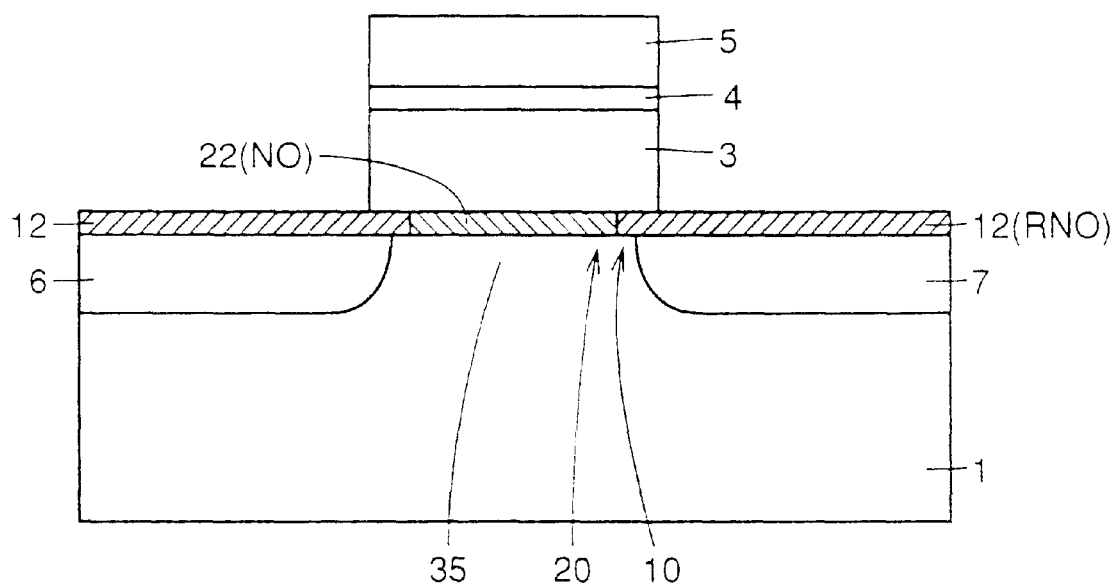
FIG. 1 is a cross section showing a flash EEPROM of a first embodiment of the invention.

Referring to FIG. 1, a flash EEPROM of a first embodiment includes a P-type semiconductor substrate 1 having a main surface, on which a source region 6 and a drain region 7 located at opposite sides of a channel region 35 are formed with a predetermined space between each other. RNO (Re-oxidized Nitrided Oxide) films 12 are formed on the main surfaces of the source and drain regions 6 and 7 and on ends of the channel region 35 near the source and drain regions 6 and 7. An NO (Nitrided Oxide) film 22 continuous to the RNO films 12 is formed on the channel region 35.

Here, the RNO film 12 is a nitrided oxide film which contains nitrogen at a content of $2.5 \times 10^{20}/cm^3$ or more and hydrogen at a content less than $3 \times 10^{20}/cm^3$. The NO film 22 is a nitrided oxide film which contains nitrogen at a content of $2.5 \times 10^{20}/cm^3$ or more and hydrogen at a content of $3 \times 10^{20}/cm^3$ or more. The nitrided oxide film differs from a nitride film in that considerable nitrogen is introduced into the P-type semiconductor substrate 1. In this embodiment 1, the NO film 22 is formed on channel hot electron (hole) injection region 20, and the RNO film 12 is formed on a drain avalanche hot carrier injection region 10.

A floating gate electrode 3, which is made of a polysilicon film containing impurity introduced thereinto, is formed on the NO film 22 and portions of the RNO films 12. A control gate electrode 5, which is made of a polysilicon film containing impurity introduced thereinto, is formed on the floating gate electrode 3 with an interlayer insulating film 4 therebetween. The RNO film 12 and NO film 12 each has a thickness of about 10 nm. The floating gate electrode 3 has a thickness of about 50 to about 100 nm. The interlayer insulating film 4 is a silicon oxide film, a silicon nitride film or a multilayer film formed of a silicon oxide film and a silicon nitride film. The interlayer insulating film 4 has a thickness which establishes such a relationship that a capacity per unit area of the interlayer insulating film 4 is equal to that of a silicon oxide film having a thickness of 20 nm. The control gate electrode 5 has a thickness of 100 to 200 nm.

In this first embodiment, an efficiency of injection of channel hot electrons can be improved owing to formation of the NO film 22 on the channel hot electron (hole) injection region as described above. Thereby, the writing efficiency can be improved without increasing a drain voltage and a gate voltage. As a result, the data writing operation can be performed at a high speed even with a low supply voltage.

In the first embodiment, the RNO film 12, into which drain avalanche hot carriers cannot be injected easily, is formed on the drain avalanche hot carrier injection region 10, so that injection of drain avalanche hot carriers can be suppressed. Thereby, even if the electric field near the drain region 7 increases due to miniaturization of elements, generation of the interface level due to implantation of drain avalanche hot carriers can be effectively prevented. Therefore, it is possible to overcome disadvantages such as variation of the threshold voltage which may be caused by generation of the interface level.

Figure 2:
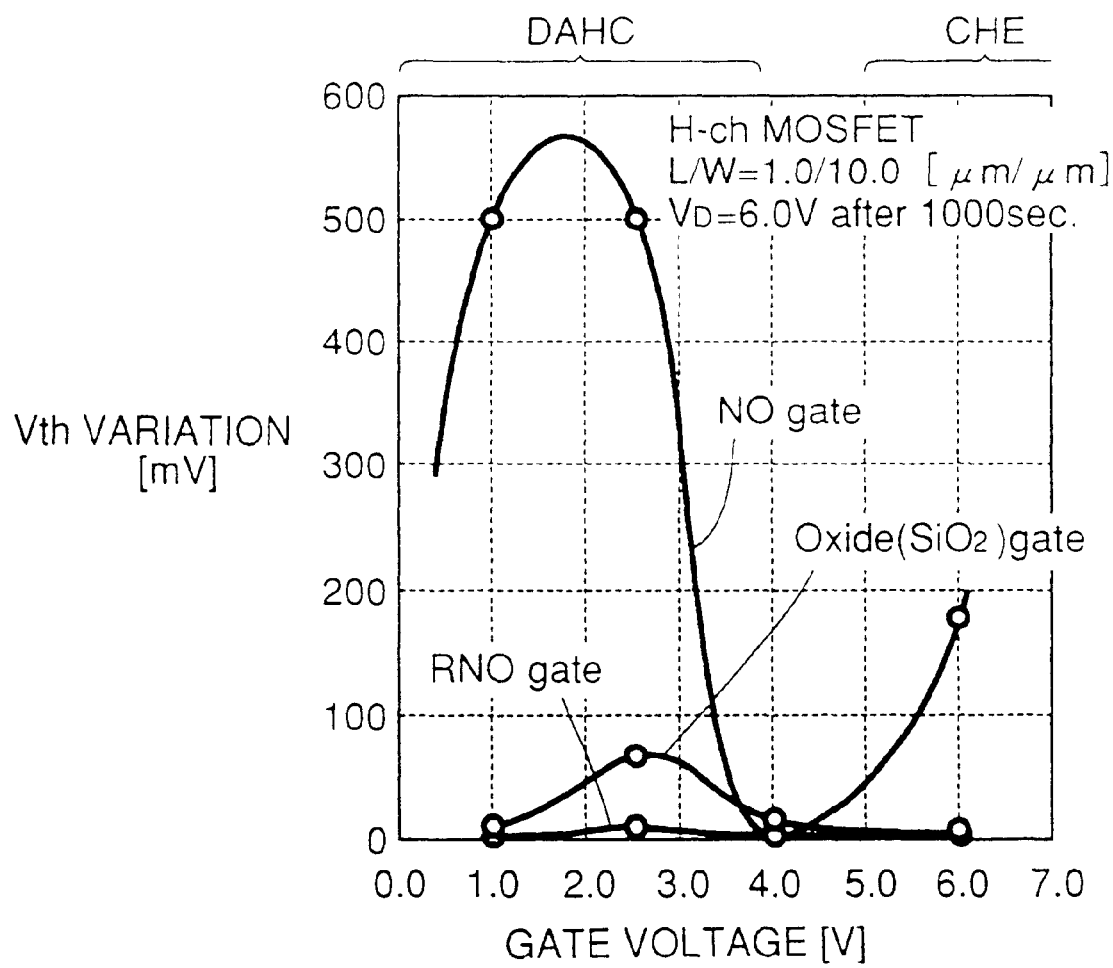
FIG. 2 shows correlation between a gate voltage and a variation of a threshold voltage $V_{th}$ in the cases where an NO film, an $SiO_2$ film and an RNO film are used as a gate insulating film of an MOS transistor, respectively.
Figure 3:
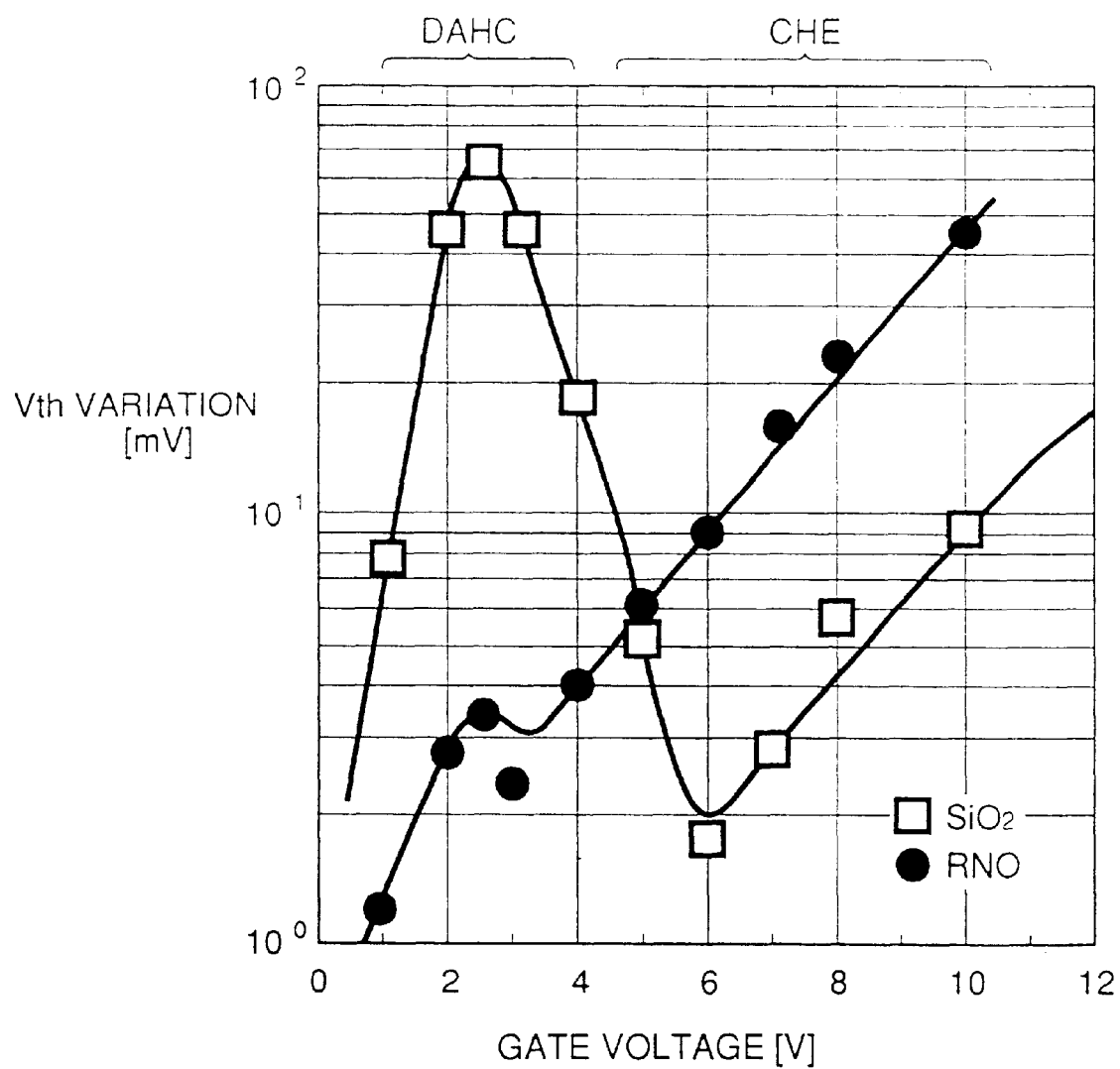
FIG. 3 shows, on an enlarged scale, the correlation shown in FIG. 2 and particularly shows data of the $SiO_2$ film and data of the RNO film.

Description will now be made on the facts that channel hot electrons can be injected easily into the NO film 22 and that drain avalanche hot carriers cannot be injected easily into the RNO film 12. FIG. 2 shows correlation which is disclosed in 1991 *International Electron Devices Meeting Technical Digest,* pp. 649–652. Referring to FIGS. 2 and 3, if the NO film is used as the gate insulating film, channel hot electron injection (CHE) is performed easily and drain avalanche hot electron injection (DAHC) is also performed easily, compared with the case where the $SiO_2$ film or RNO film is used as the gate insulating film.

Figure 4:
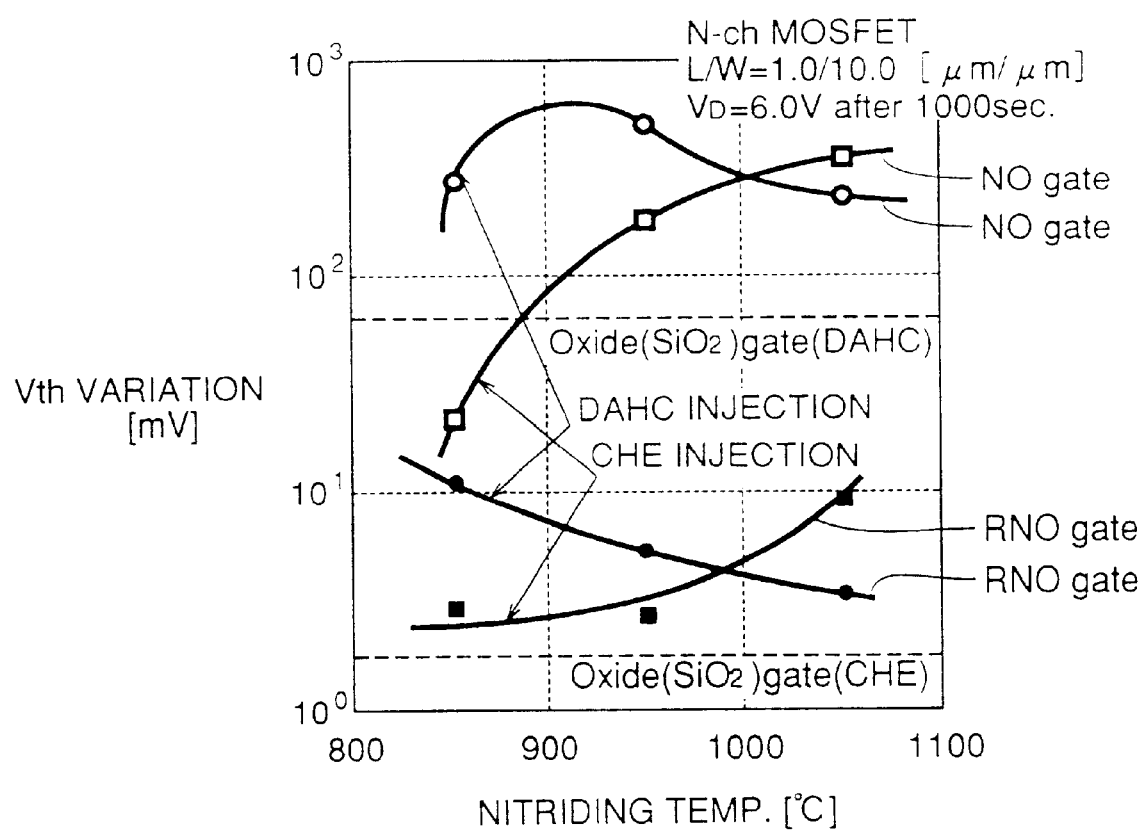
FIG. 4 shows correlation between a nitriding temperature and a variation of a threshold voltage $V_{th}$.

As is apparent from FIG. 4, the efficiency of injection of channel hot electrons (CHE) of the NO film is remarkably higher than those of the RNO film and $SiO_2$ film. Also, the efficiency of injection of channel hot electrons of the RNO film is higher than that of the $SiO_2$ film. Drain avalanche hot carriers (DAHC) can be injected most easily into the NO film. Drain avalanche hot carriers cannot be injected easily into the RNO film compared with the $SiO_2$ film. These tendencies and properties do not change even if the nitriding temperature changes.

From the foregoing, susceptibility of injection of channel hot electrons can be expressed by the following formula (1):

$$NO >> RNO > SiO_2 \qquad (1)$$

Susceptibility of injection of drain avalanche hot carriers is expressed by the following formula (2):

$$NO > SiO_2 > RNO \qquad (2)$$

In the embodiment shown in FIG. 1, the NO film 22 is formed at the channel hot electron injection region 20, and the RNO film 12 is formed at the drain avalanche hot carrier injection region 10 in consideration of relationship expressed by the formulas (1) and (2). Thereby, the efficiency of injection of channel hot electrons can be improved while suppressing injection of drain avalanche hot carriers.

Referring to FIGS. 5–9, a process of manufacturing the flash EEPROM of the first embodiment will be described below.

Figure 5:
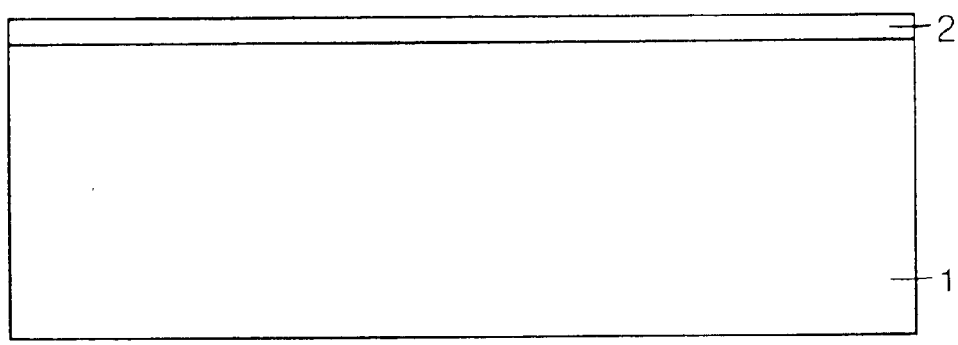
FIGS. 5–9 are cross sections showing 1st to 5th steps in a process of manufacturing the flash EEPROM of the first embodiment shown in FIG. 1, respectively.
Figure 6:
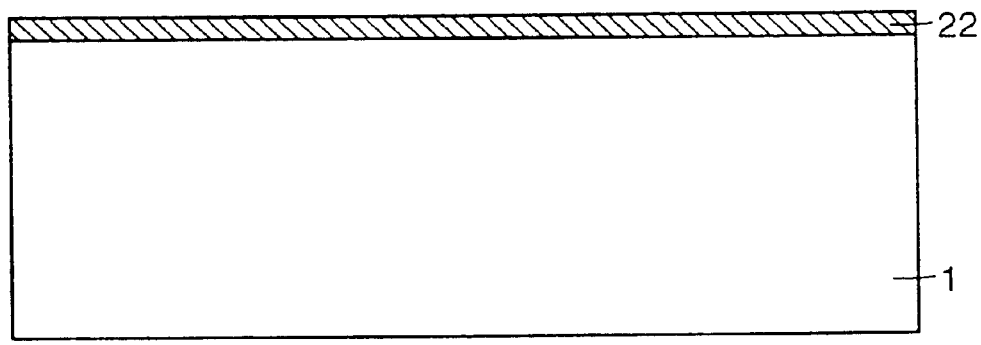

As shown in FIG. 5, one prepares the P-type semiconductor substrate 1 made of monocrystal silicon. The silicon oxide film 2 of about 10 nm in thickness is formed on the P-type semiconductor substrate 1 by oxidation or deposition. The silicon oxide film 2 is nitrided to form the NO film 22 containing nitrogen at a concentration of $2.5 \times 10^{20}/cm^3$ or more and hydrogen at a concentration of $3 \times 10^{20}/cm^3$ or more as shown in FIG. 6. The nitriding of the silicon oxide film 2 is performed, for example, by exposing the silicon oxide film 2 to ammonia atmosphere at a temperature of 800° C. to 1100° C. for 10 to 60 seconds.

Figure 7:
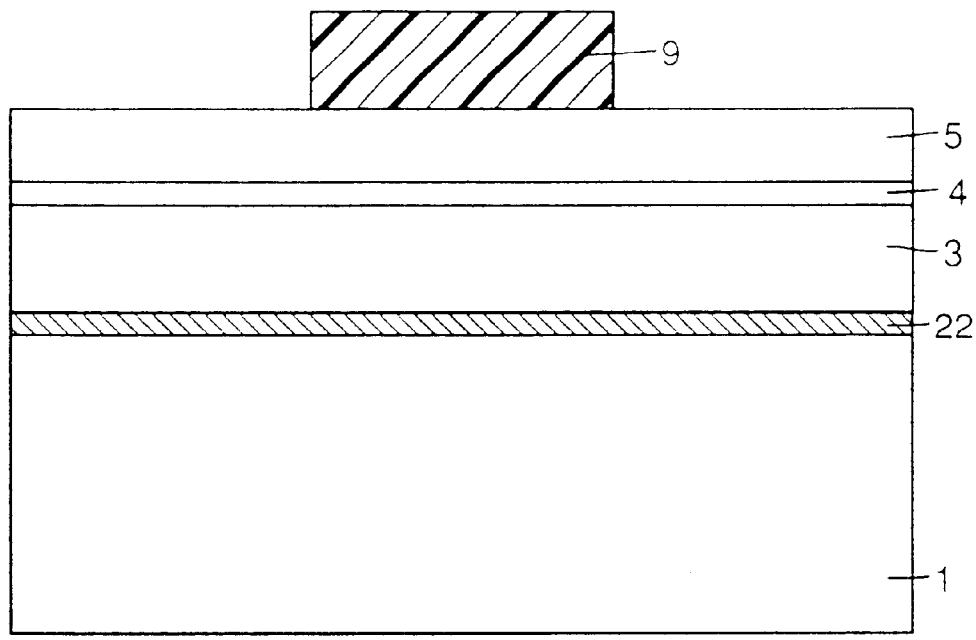

As shown in FIG. 7, the polysilicon film 3, which has a thickness of about 50 to about 100 nm and contains a large amount of impurity introduced thereinto, is formed on the NO film 22 by the CVD method. The interlayer insulating film 4, which is a silicon oxide film, a silicon nitride film, or a multilayer film of a silicon oxide film and a silicon nitride film is formed on the polysilicon film 3. This interlayer insulating film 4 has a thickness establishing such a relationship that the capacity per unit area of thereof is equal to the capacity per unit area of the silicon oxide film of 20 nm in thickness. However, in order to reduce the voltage to be applied to the control gate electrode, it is preferable to reduce the thickness of the interlayer insulating film 4 as long as the intended reliability is not impaired. Thereafter, the polysilicon film 5 which has a thickness of about 100 to about 200 nm and contains a large amount of impurity is formed on the interlayer insulating film 4 by the CVD method. A photoresist 9 is formed at a predetermined region on the polysilicon film 5.

Figure 8:
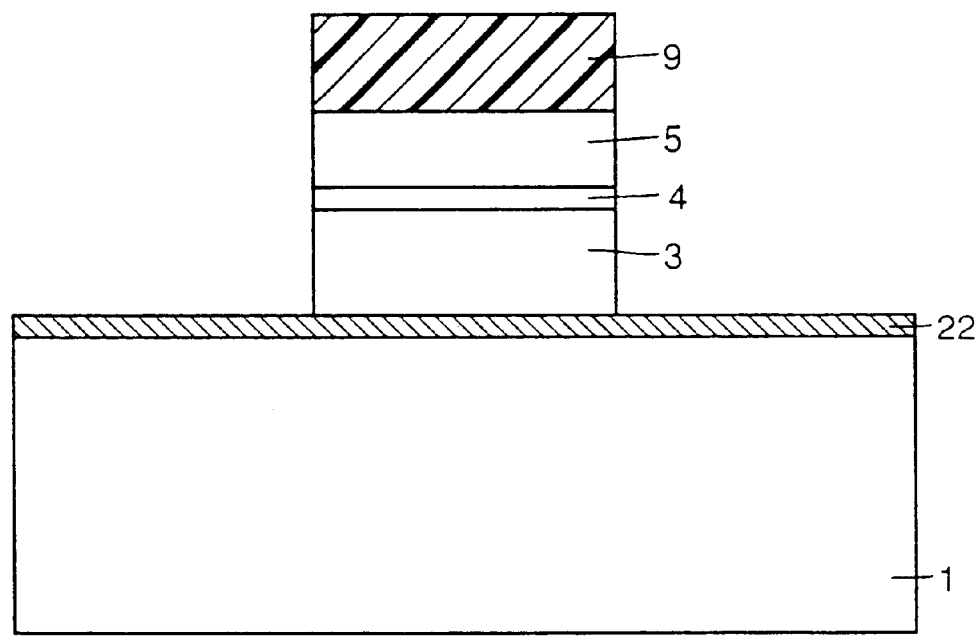

Using the photoresist 9 as a mask, anisotropic etching is effected on the polysilicon film 5, interlayer insulating film 4 and polysilicon film 3. Thereby, the floating gate electrode 3 made of the polysilicon film, the interlayer insulating film 4 and the control gate electrode 5 made of the polysilicon film are formed as shown in FIG. 8. The floating gate electrode 3 thus formed has a width of, e.g., about 0.5 $\mu$m. Thereafter, the photoresist 9 is removed.

Then, annealing or oxidation is effected at a temperature of 800° C. to 1100° C. for 5 to 60 seconds. This reduces the concentration of hydrogen in the exposed regions of the NO film 22 and partial regions in the portion of the NO film 22 located under the floating gate electrode 3. Thereby, the RNO films 12 containing nitrogen at the concentration of $2.5 \times 10^{20}/cm^3$ or more and hydrogen at the concentration less than $3 \times 10^{20}/cm^3$ are formed as shown in FIG. 9.

Finally, as shown in FIG. 1, N-type impurity such as arsenic is ion-implanted at the concentration of $1 \times 10^{20}/cm^3$ or more into the P-type semiconductor substrate 1 using the control gate electrode 5 as a mask, as shown in FIG. 1. Thereby, the N-type source region 6 and the N-type drain region 7 are formed. In this manner, the flash EEPROM of the first embodiment is completed.

Figure 9:
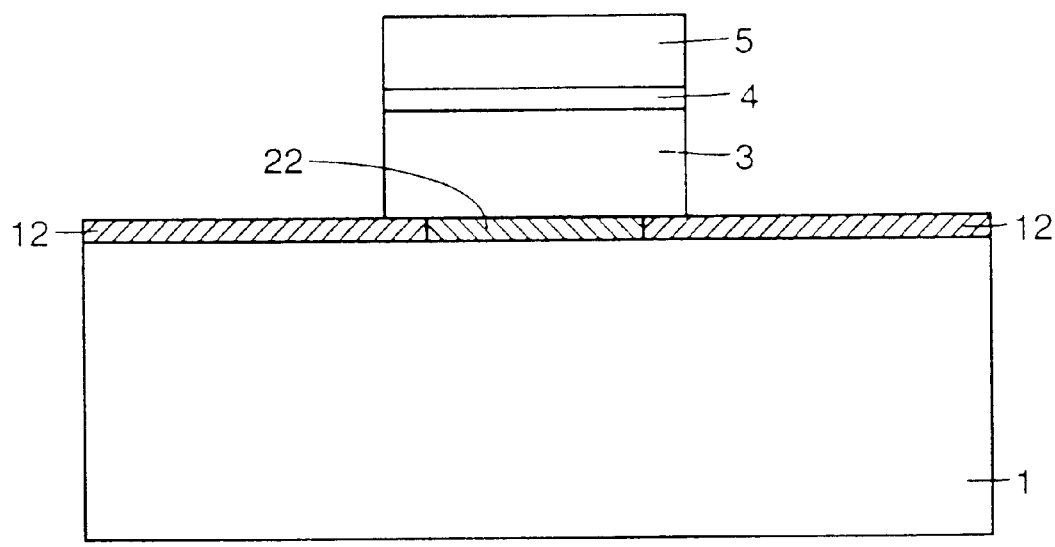

Ion-implantation for forming the source and drain regions 6 and 7 can be effected before formation of the RNO film 12 shown in FIG. 9. In order to adjust a positional relationship between the RNO film 12 and a junction region of the drain region 7, oblique ion implantation may be utilized as the ion implanting method for forming the drain region 7. Further, the drain region 7 and the source region 6 may be formed at different steps.

Figure 10:
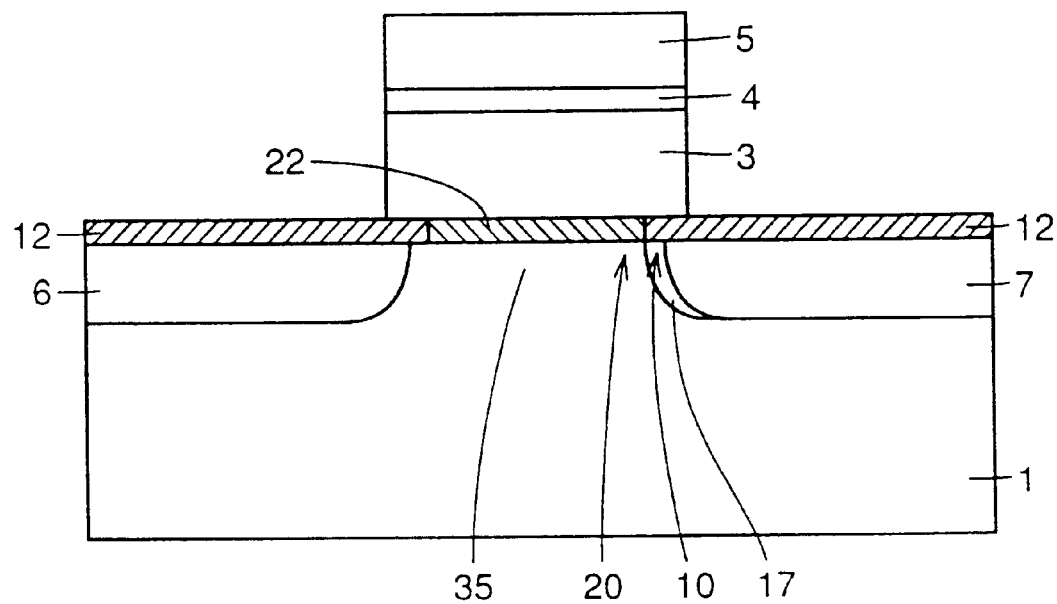
FIG. 10 is a cross section showing a flash EEPROM of a second embodiment of the invention.

Referring to FIG. 10, a flash EEPROM of a second embodiment is provided with a P-type impurity layer 17 near a junction region of the drain region 7. This increases an electric field at the junction of the drain region 7, and consequently, improves the efficiency of injection of channel hot electrons. A P-type impurity layer may be formed similarly at the side of the source region 6. The P-type impurity layer 37 is practically formed by oblique ion implantation of P-type impurity such as boron into the P-type semiconductor substrate 1.

Figure 11:
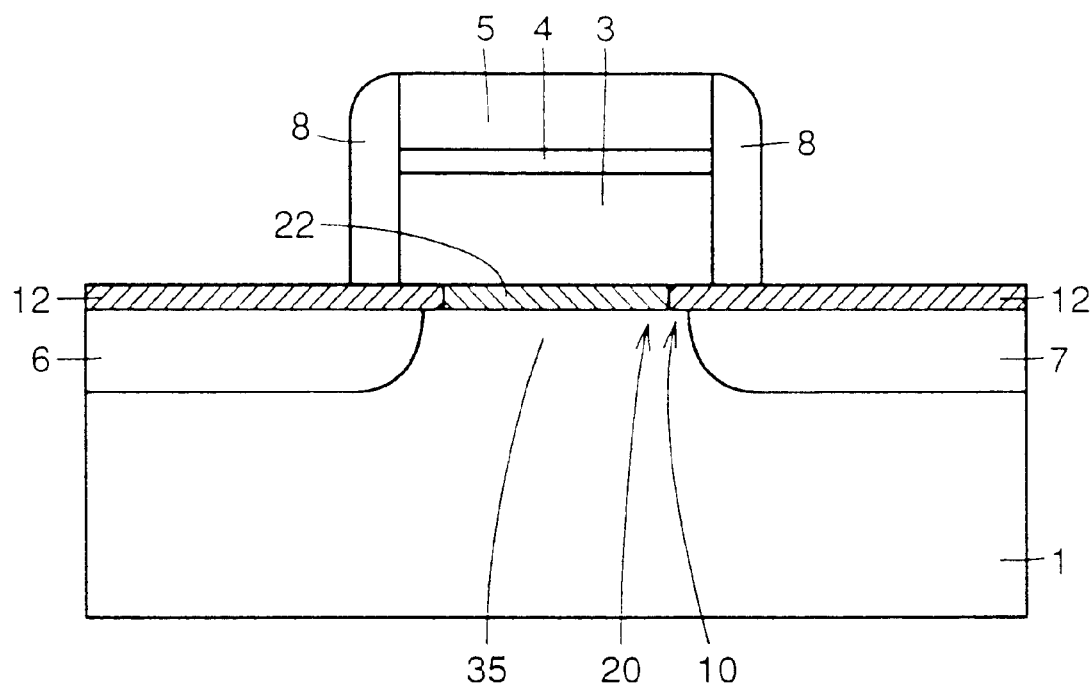
FIG. 11 is a cross section showing a flash EEPROM of a third embodiment of the invention.

Referring to FIG. 11, a flash EEPROM of a third embodiment differs from the first and second embodiments in that side wall insulating films 8 are formed at opposite side walls of the floating gate electrode 3, interlayer insulating film 4 and control gate electrode 5. The side wall insulating film 8 is provided for the purpose of adjusting a positional relationship between the drain region 7 and the RNO film 12. More specifically, the drain region 7 is formed by the ion implantation after forming the side wall insulating films 8, whereby the drain region 7 can be formed at outer position. In this case, the source region 6 may be formed before or after formation of the side wall insulating film 8.

Figure 12:
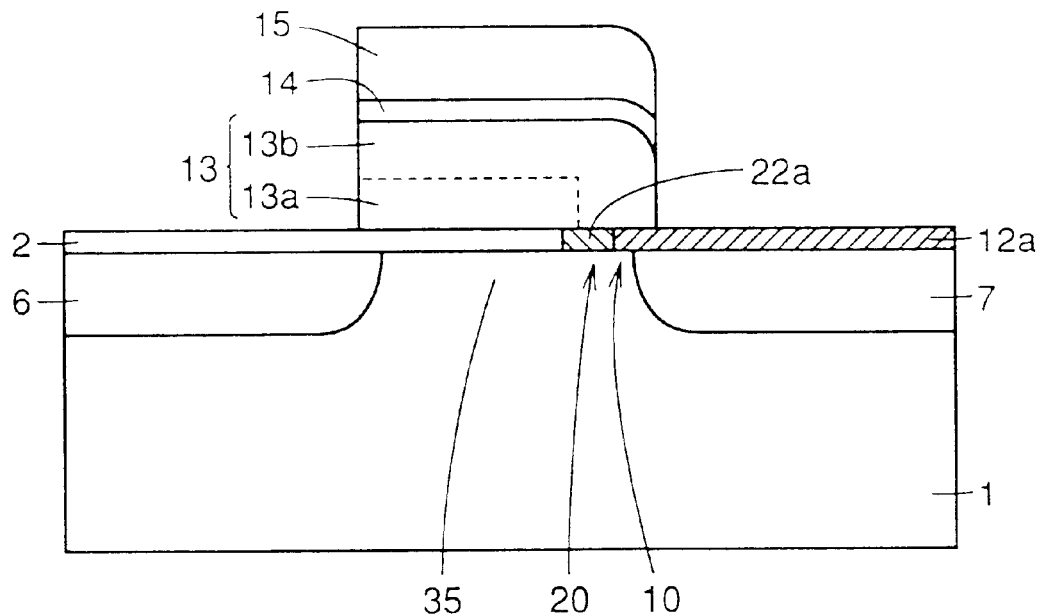
FIG. 12 is a cross section showing a flash EEPROM of a fourth embodiment of the invention.

Referring to FIG. 12, a flash EEPROM of a fourth embodiment is provided with an RNO film 12a located on the drain region 7 and the drain avalanche hot carrier injection region 10. An NO film 22a is formed on the channel hot electron injection region 20. The silicon oxide film 2 continuous to the NO film 22a is formed on the source region 6 and channel region 35. On the channel region 35 is formed a floating gate electrode 13, which is made of a first polysilicon film 13a and a second polysilicon film 13b, with the silicon oxide film 2, NO film 22a and RNO film 12a therebetween.

On the floating gate electrode 13 is formed an interlayer insulating film 14, which is made of a silicon oxide film, a silicon nitride film or a multilayer film formed of a silicon oxide film and a silicon nitride film. The interlayer insulating film 14 has a thickness establishing a relationship that a capacity per unit area thereof is equal to a capacity per unit area of a silicon oxide film having a thickness of 20 nm. On the interlayer insulating film 14 is formed a control gate electrode 15 made of a polysilicon film, which has a thickness of about 100 to 200 nm and contains a large amount of impurity introduced thereinto. The first polysilicon film 13a forming the floating gate electrode 13 has an end located on the NO film 22a. The second polysilicon film 13b covers an upper surface and one of side surfaces of the first polysilicon film 13a.

Also in this fourth embodiment, the efficiency of injection of channel hot electrons can be improved owing to formation of the NO film 22a containing hydrogen at a high density on the N-channel hot electron injection region 20. Thereby, the injection efficiency can be improved without applying a high drain voltage and a high gate voltage in contrast to the prior art. As a result, the time period for writing data can be reduced with a low supply voltage. Owing to formation of the RNO film 12a containing hydrogen at a low density on the drain avalanche hot carrier injection region 10, injection of drain avalanche hot carrier during the data writing operation can be effectively suppressed. Thereby, it is possible to prevent generation of the interface level which may be caused by the injection of drain avalanche hot carriers. Therefore, it is possible to prevent disadvantages such as variation of the threshold voltage which may be caused by generation of the interface level.

Referring to FIGS. 13–18, a process of manufacturing the flash EEPROM of the fourth embodiment will be described below.

Figure 13:
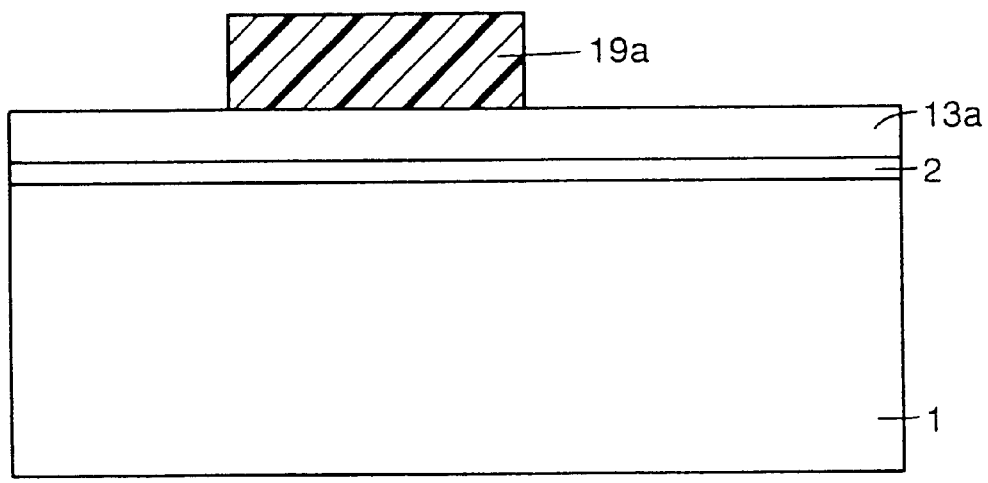
FIGS. 13–18 are cross sections showing 1st to 6th steps in a process of manufacturing the flash EEPROM of the fourth embodiment shown in FIG. 12, respectively.
Figure 14:
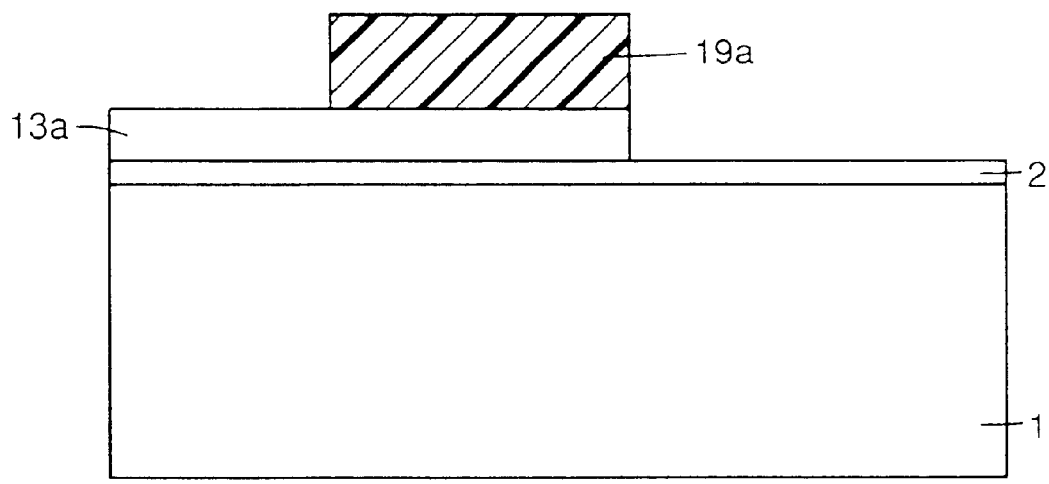

Referring first to FIG. 13, the silicon oxide film 2 having a thickness of about 10 nm is formed on the P-type semiconductor substrate 1 by oxidation or deposition. The first polysilicon film 13a having a thickness of about 30 to 100 nm and containing a large amount of impurity introduced thereinto is formed on the silicon oxide film 2 by the CVD method. A photoresist 19a is formed on a predetermined region of the first polysilicon film 13a by photolithography. Using the photoresist 19a as a mask, anisotropic etching is effected on the first polysilicon film 13a to form the first polysilicon film 13a shown in FIG. 14. Thereafter, the photoresist 19a is removed.

Figure 15:
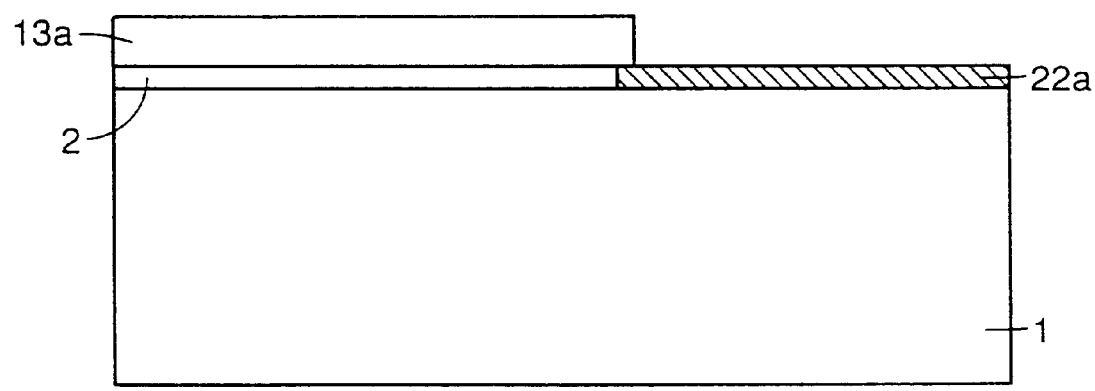

Then, using the first polysilicon film 13a as a mask, a portion of the silicon oxide film 2 is nitrided. Thereby, the NO film 22a is formed as shown in FIG. 15. This nitriding is effected for example by exposing the silicon oxide film 2 to ammonia atmosphere at a temperature of 800° C. to 1100° C. for 10 to 60 seconds.

Figure 16:
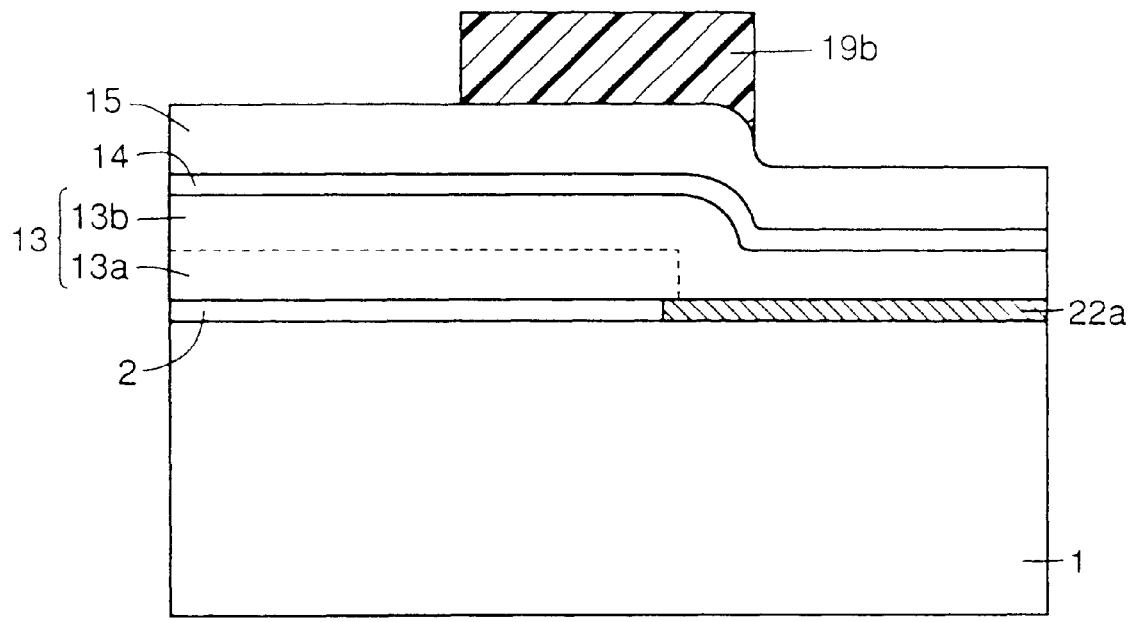
Figure 17:
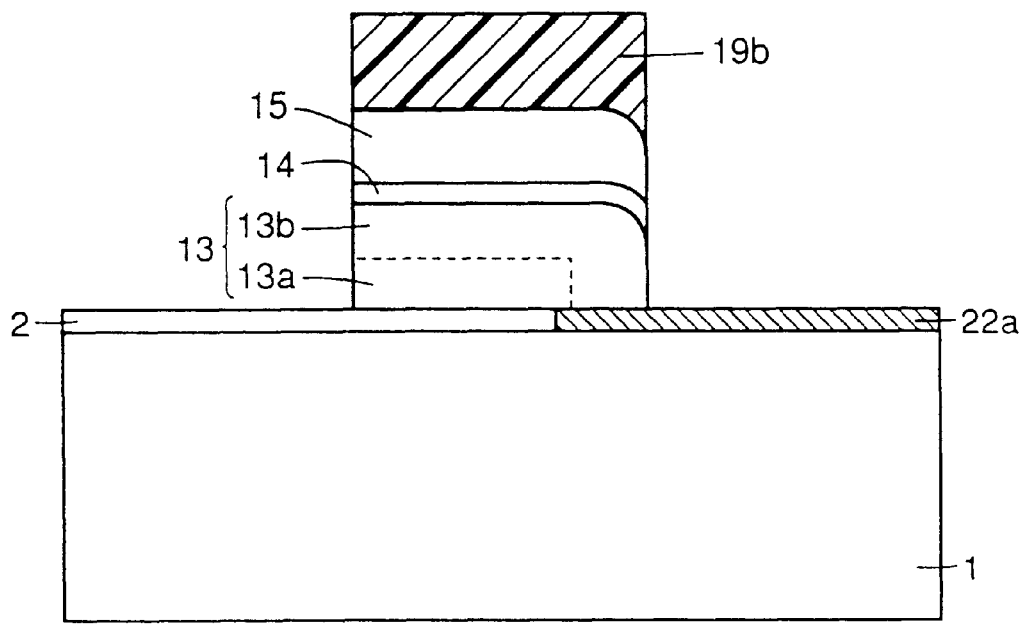

Then, as shown in FIG. 16, the second polysilicon film 13b, which has a thickness of about 50 to 100 nm and contains a large amount of impurity introduced thereinto, is formed on the NO film 22a and first polysilicon film 13a by the CVD method. The interlayer insulating film 14 is formed on the second polysilicon film 13b. The polysilicon film 15, which has a thickness of about 100 to 200 nm and contains a large amount of impurity introduced thereinto, is formed on the interlayer insulating film 14. A photoresist 19b is formed at a predetermined region on the polysilicon film 15.

Using the photoresist 19b as a mask, anisotropic etching is effected on the polysilicon film 15, interlayer insulating film 14, second polysilicon film 13b and first polysilicon film 13a. Thereby, the floating gate electrode 13 made of the first and second polysilicon films 13a and 13b, the interlayer insulating film 14 and the control gate electrode 15 are formed. The floating gate electrode 13 thus formed has a width of about 0.5 μm. Thereafter, the photoresist 19b is removed.

Figure 18:
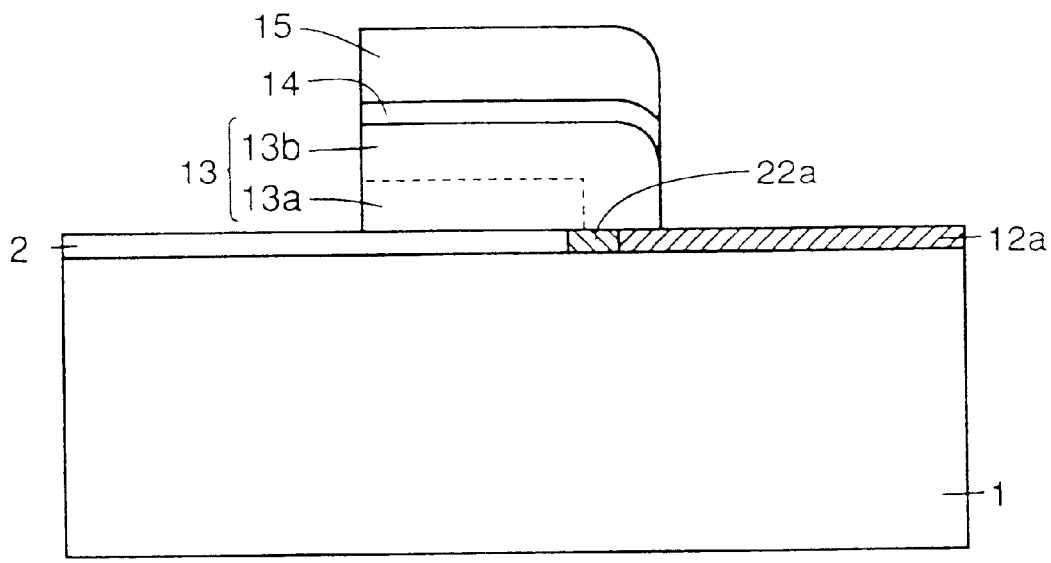

Then, annealing or oxidation is performed at a temperature of 800° C. to 1100° C. for 5 to 60 seconds. This reduces concentration of hydrogen at the exposed portion of the NO film 22a (see FIG. 17) and a portion of the region of the NO film 22a located under the second polysilicon film 13b. As a result, the RNO film 12a shown in FIG. 18 is formed.

Finally, as shown in FIG. 12, the control gate electrode 15 is used as a mask, and N-type impurity such as arsenic is ion-implanted into the P-type semiconductor substrate 1 at a concentration of $1 \times 10^{15}/cm^2$ or more. Thereby, the source and drain regions 6 and 7 are formed. In this manner, the flash EEPROM of the fourth embodiment is completed. The ion implantation for forming the source and drain regions 6 and 7 can be performed before the step shown in FIG. 18, and/or may be performed by the oblique ion implantation method. If desired, the source and drain regions 6 and 7 may be formed at different steps.

Figure 19:
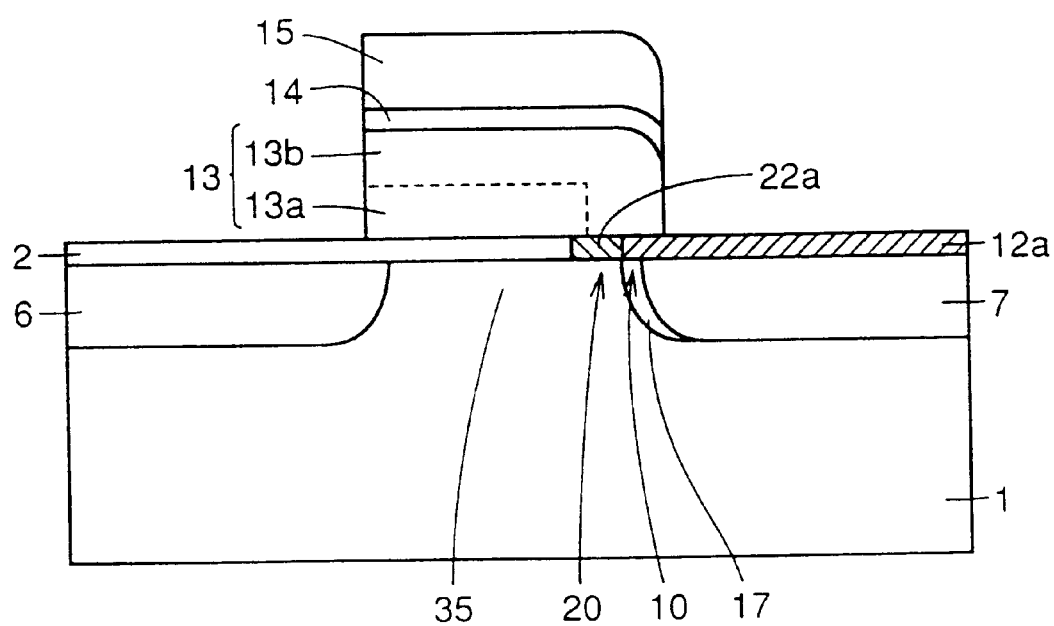
FIG. 19 is a cross section showing a flash EEPROM of a fifth embodiment of the invention.

Referring to FIG. 19, a flash EEPROM of a fifth embodiment is provided with a P-type impurity layer 17 which covers an end of the N-type drain region 7 near the channel region. This enhances the electric field near the drain region 7, and hence further improves the efficiency of injection of channel hot electrons.

Figure 20:
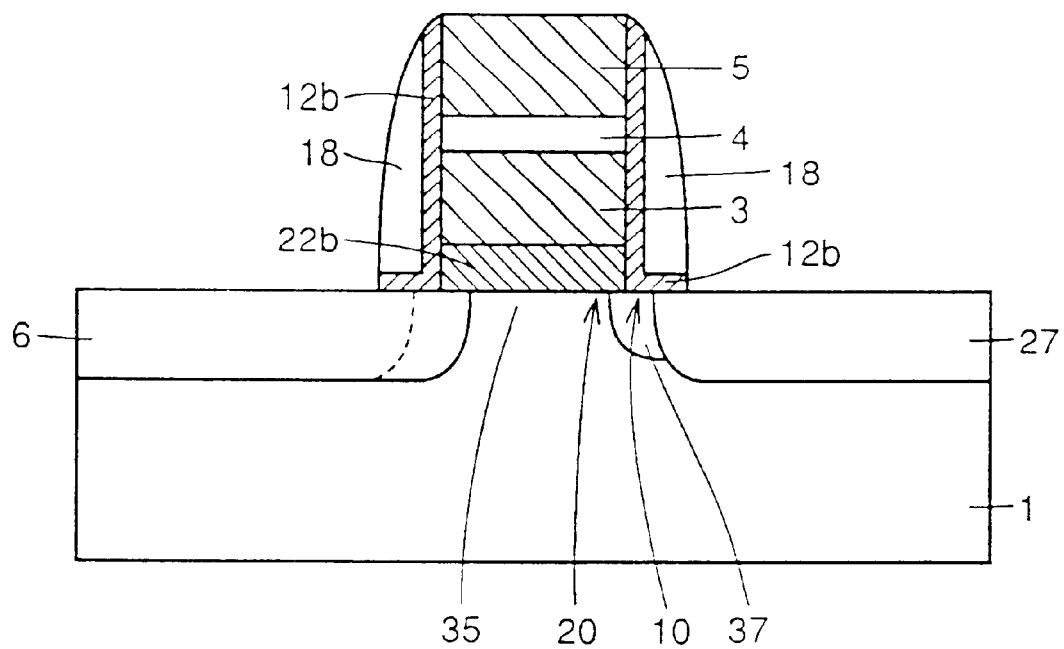
FIG. 20 is a cross section showing a flash EEPROM of a sixth embodiment of the invention.

Referring to FIG. 20, a flash EEPROM of a sixth embodiment is provided with the source region 6 and a heavily doped drain region 27, which are formed on the main surface of the P-type semiconductor substrate 1 with a predetermined space between each other and are located at opposite sides of the channel region 35. A lightly doped drain region 37 is formed at a side of the heavily doped drain region 27 near the channel region 35. An NO film 22b of about 10 nm in thickness is formed on the channel region 35.

On the NO film 22b is formed the floating gate electrode 3, which has a thickness of about 50 to 100 nm and contains a large amount of impurity introduced thereinto. The interlayer insulating film 4 is formed on the floating gate electrode 3. The interlayer insulating film 4 is formed of a silicon oxide film, a silicon nitride film or a multilayer film made of a silicon oxide film and a silicon nitride film. The interlayer insulating film 4 has a thickness which establishes a relationship that a capacity per unit area thereof is equal to a capacity per unit area of the silicon oxide film having a thickness of 20 nm. On the interlayer insulating film 4 is formed the control gate electrode 5 which has a thickness of about 100 to about 200 nm and contains a large amount of impurity introduced thereinto. There is also provided RNO films 12b which are located on opposite side surfaces of the control gate electrode 5, interlayer insulating film 4, floating gate electrode 3 and NO film 22b and also located on the source region 6, lightly doped drain region 37 and heavily doped drain region 27. The side wall insulating films 18 are formed on the side surfaces of the RNO films 12b, respectively.

In this sixth embodiment, the drain region of the LDD structure is formed of the lightly doped drain region 37 and the heavily doped drain region 27. In this LDD structure, the drain avalanche hot carrier injection region 10 is located in the lightly doped drain region 37. The RNO film 12b containing hydrogen at a low concentration less than $3 \times 10^{20}/cm^3$ is formed on the drain avalanche hot carrier injection region 10. The NO film 22b containing hydrogen at a relatively high concentration of $3 \times 10^{20}/cm^3$ or more is formed on the channel hot electron (hole) injection region 20. Owing to this NO film 22b, it is possible to improve the efficiency of implantation of channel hot electrons during the data writing operation. Also owing to the RNO film 12b, it is possible to suppress injection of drain avalanche hot carriers during the data writing operation.

Referring to FIGS. 21 to 32, a process of manufacturing the flash EEPROM of the sixth embodiment will be described below.

Figure 21:
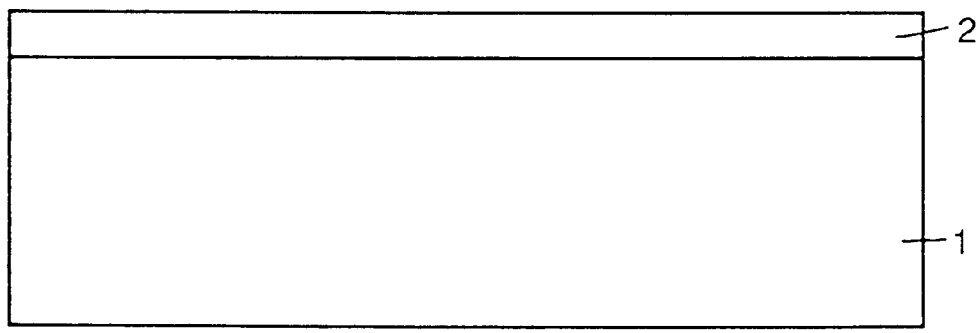
FIGS. 21–32 are cross sections showing 1st to 12th steps in a process of manufacturing the flash EEPROM of the sixth embodiment shown in FIG. 20, respectively.

Referring first to FIG. 21, the surface of the P-type semiconductor substrate 1 is oxidized to form the silicon oxide film 2 having a thickness of about 10 nm on the P-type semiconductor substrate 1. The silicon oxide film 2 may be formed by the CVD method.

Figure 22:
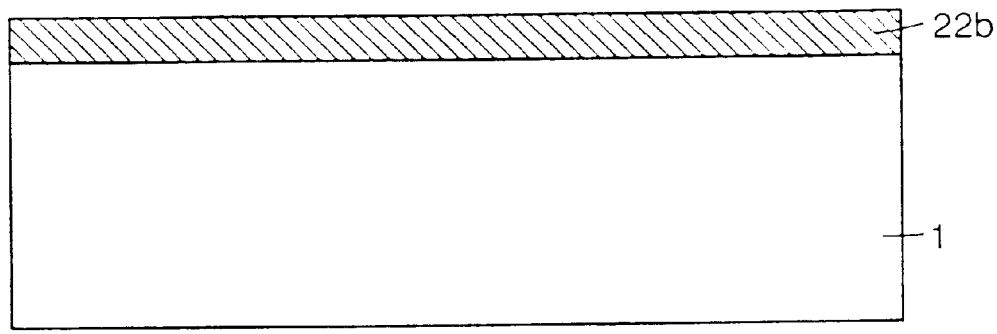

The silicon oxide film 2 is then nitrided to form the NO film 22b containing hydrogen at a relatively high concentration of $3 \times 10^{20}/cm^3$ or more as shown in FIG. 22. This nitriding is effected for example by exposing the silicon oxide film 2 to ammonia atmosphere at a temperature of 800° C. to 1100° C. for 10 to 60 seconds.

Figure 23:
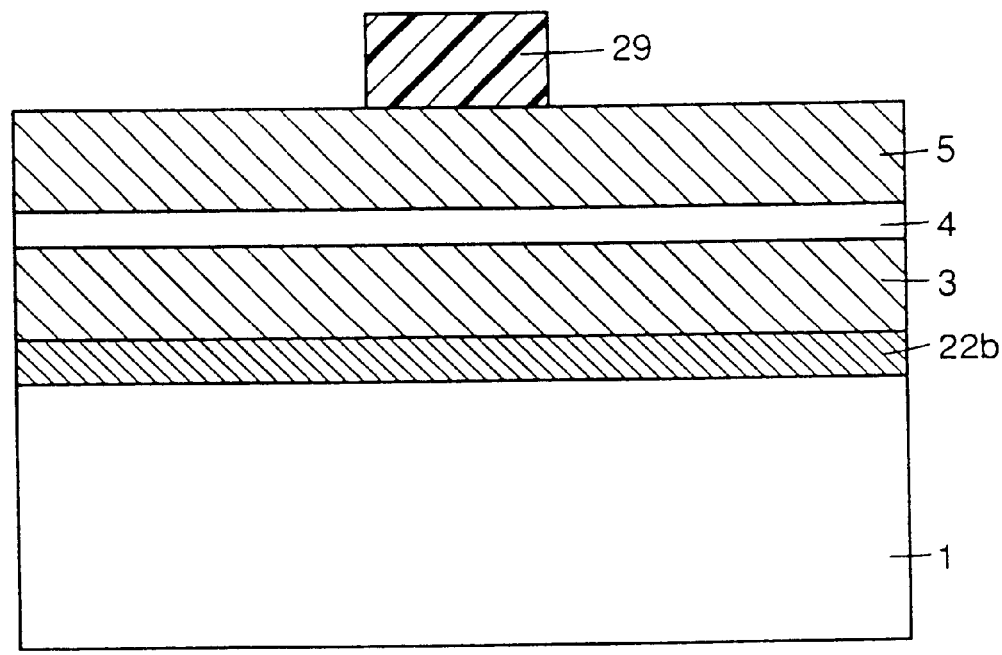
Figure 24:
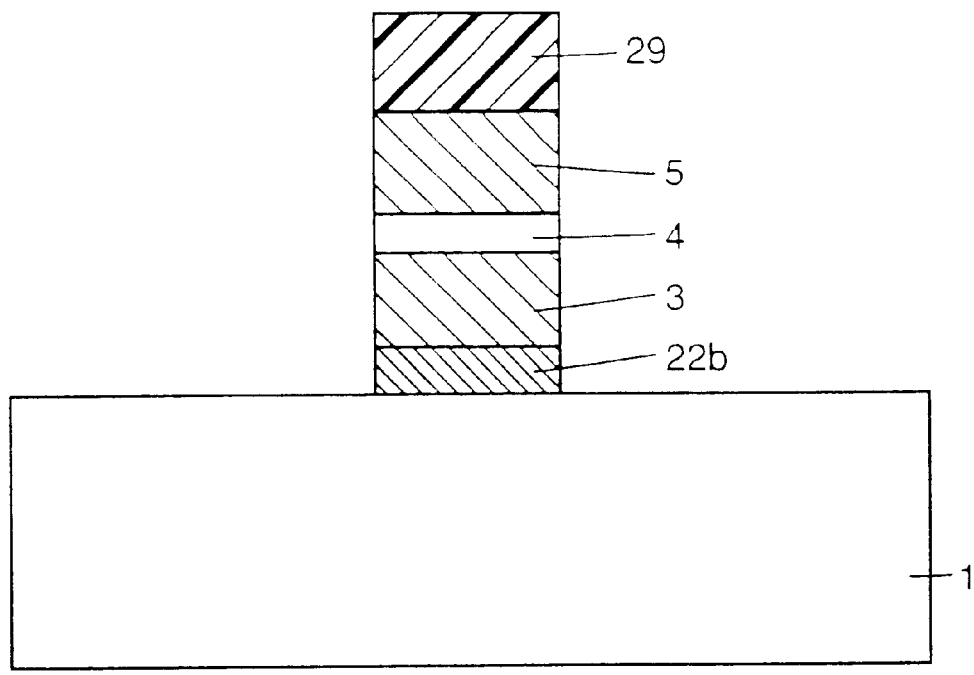

Then, as shown in FIG. 23, the polysilicon film 3 having a thickness of about 50 to 100 nm and containing a large amount of impurity introduced thereinto is formed on the NO film 22b. The interlayer insulating film 4 is formed on the polysilicon film 3. The interlayer insulating film 4 is made of the silicon oxide film, the silicon nitride film or the multilayer film made of the silicon oxide film and the silicon nitride film. The interlayer insulating film 4 has the thickness establishing a relationship that a capacity per unit area thereof is equal to a capacity per unit area of a silicon oxide film having a thickness of 20 nm. Thereafter, the polysilicon film 5 having a thickness of about 100 to 200 nm and containing a large amount of impurity is formed on the interlayer insulating film 4. A photoresist 29 is formed at a predetermined region on the polysilicon film 5. Using the photoresist 29 as a mask, anisotropic etching is effected on the polysilicon film 5, interlayer insulating film 4, polysilicon film 3 and NO film 22b. Thereby, the control gate electrode 5, interlayer insulating film 4, floating gate electrode 3 and NO film 22b are formed as shown in FIG. 24. Thereafter, the photoresist 29 is removed.

Figure 25:
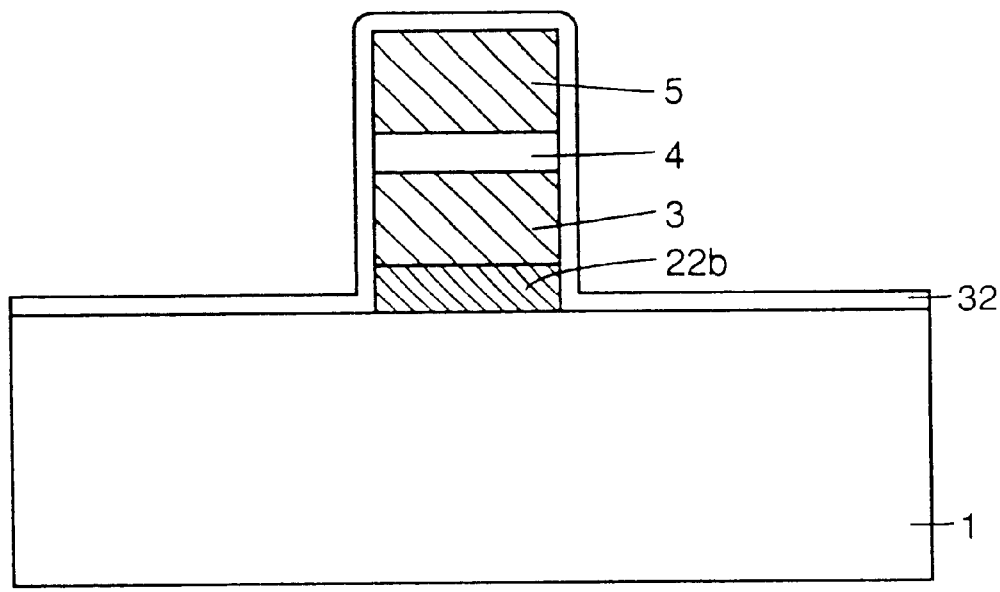

Then, a silicon oxide film 32 having a thickness of about 4 to 20 nm and covering the whole surface is formed by oxidation or deposition as shown in FIG. 25.

Figure 26:
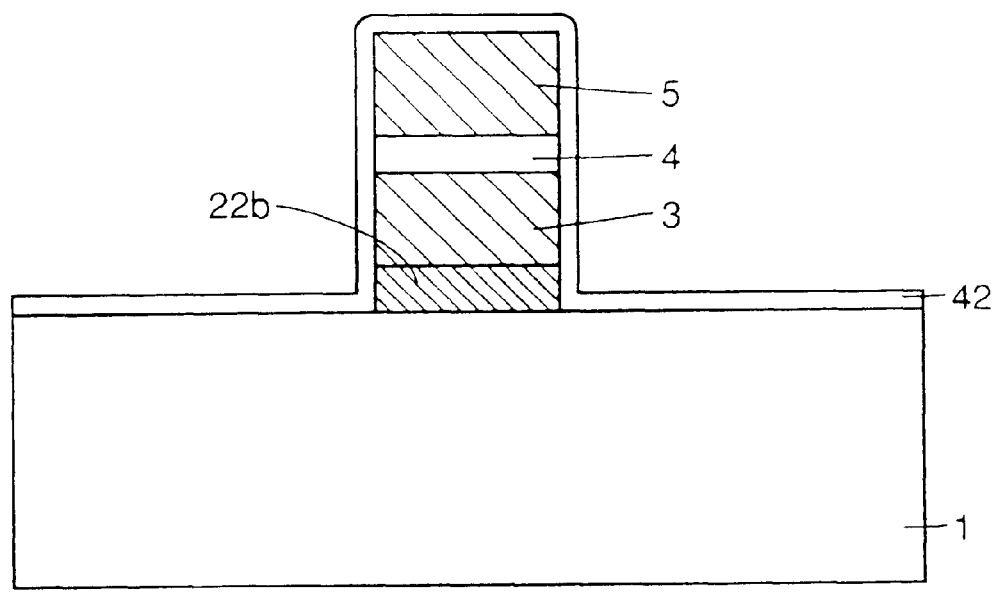
Figure 27:
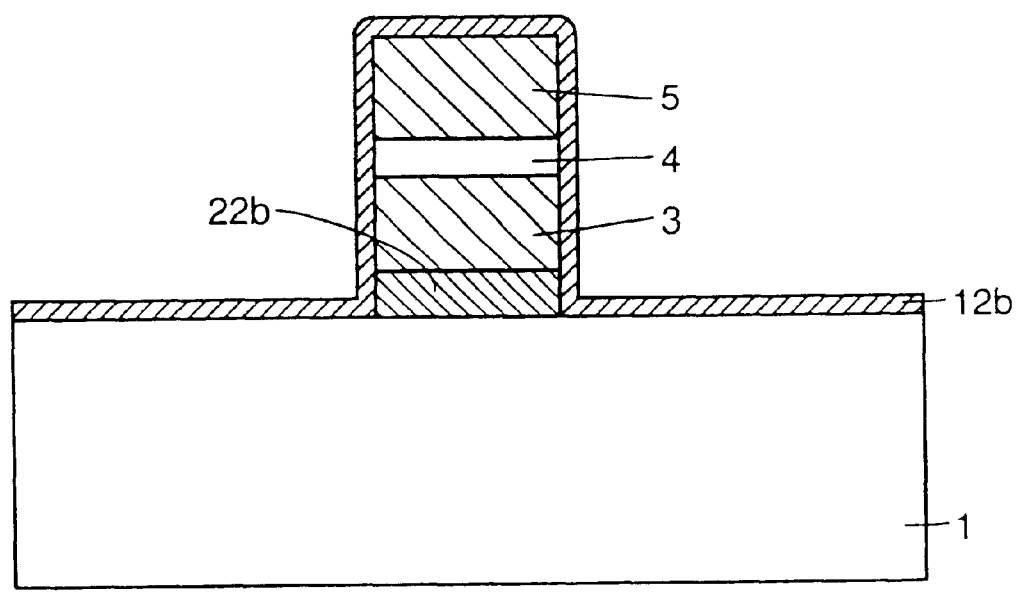

The silicon oxide film 32 is nitrided for example by exposing the same to ammonia atmosphere at a temperature of 800° C. to 1100° C. for 10 to 60 seconds. Thereby, as shown in FIG. 26, an NO film 42 containing hydrogen at a relatively high concentration of $3 \times 10^{20}/cm^3$ or more is formed as shown in FIG. 26. Then, anneal or oxidation is effected on the NO film 42 at a temperature of 800° C. to 1100° C. for 5 to 60 seconds. This produces the RNO film 12b containing nitrogen at the concentration of $2.5 \times 10^{20}/cm^3$ or more and hydrogen at the concentration less than $3 \times 10^{20}/cm^3$ as shown in FIG. 27.

Figure 28:
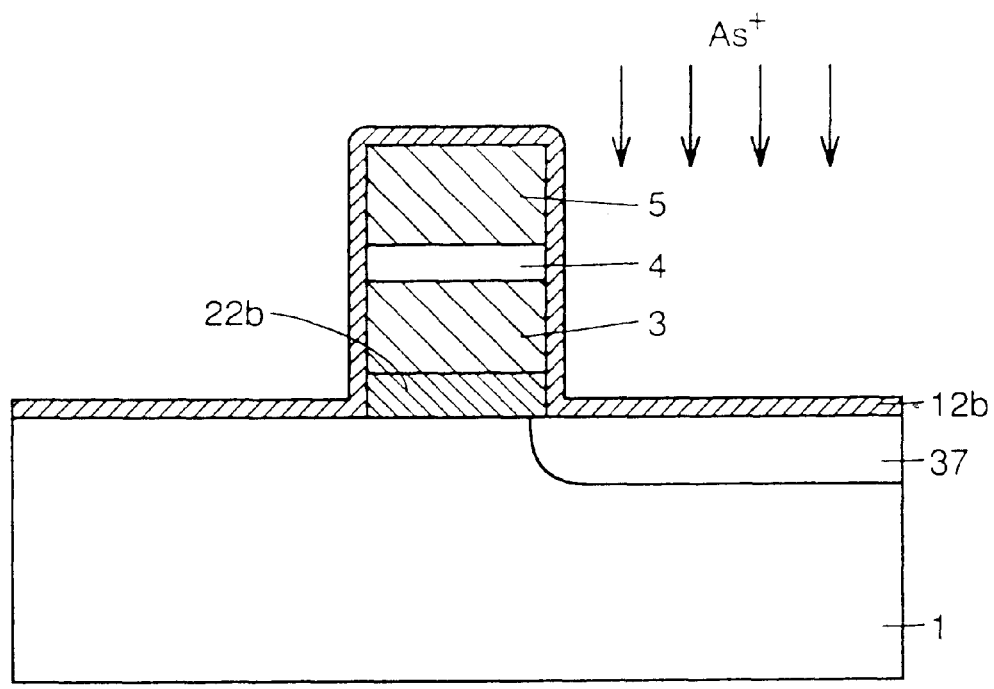

Then, as shown in FIG. 28, N-type impurity such as arsenic is ion-implanted at a concentration of $1 \times 10^{14}/cm^2$ or more into a region of the P-type semiconductor substrate 1 at which the drain region is to be formed. Thereby, the lightly doped drain region 37 is formed.

Figure 29:
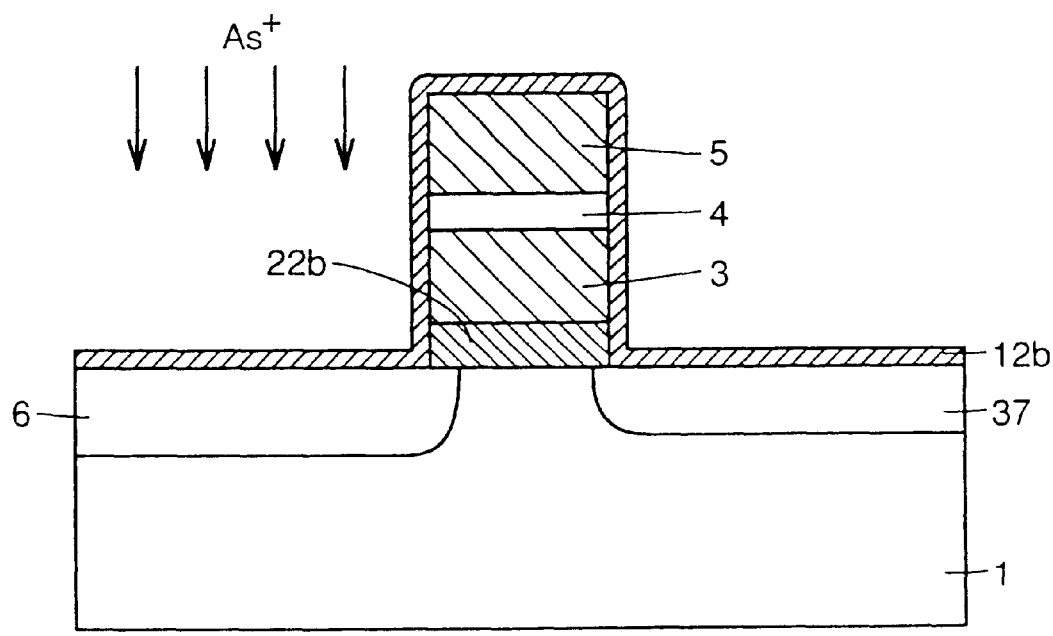

As shown in FIG. 29, N-type impurity such as arsenic is ion-implanted at a concentration of $1\times10^{15}/cm^2$ or more into a region of the P-type semiconductor substrate 1 at which the source region is to be formed. Thereby, the source region 6 is formed.

Figure 30:
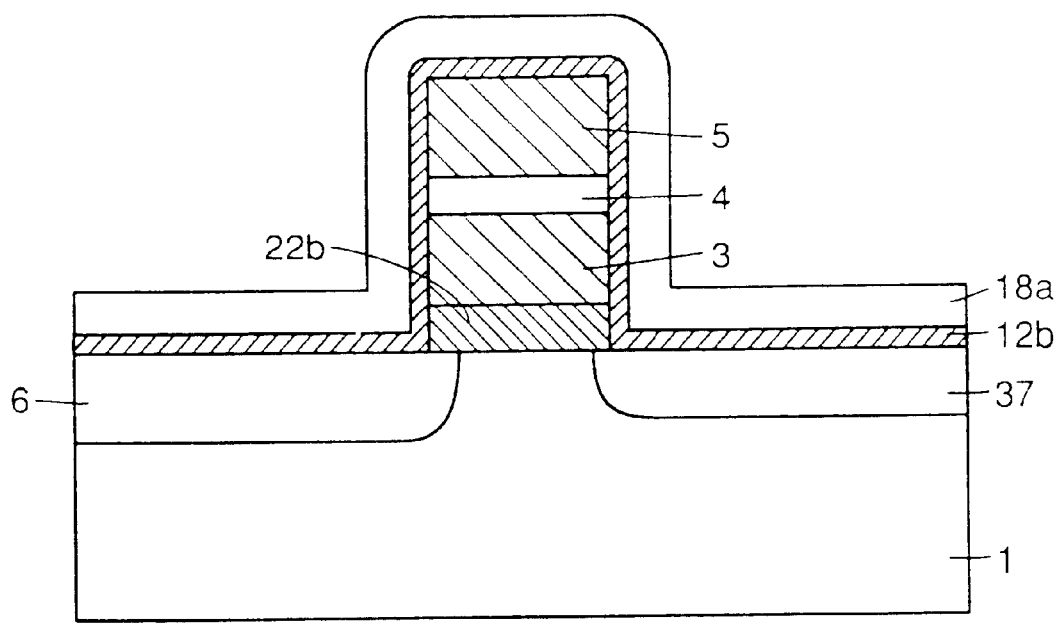
Figure 31:
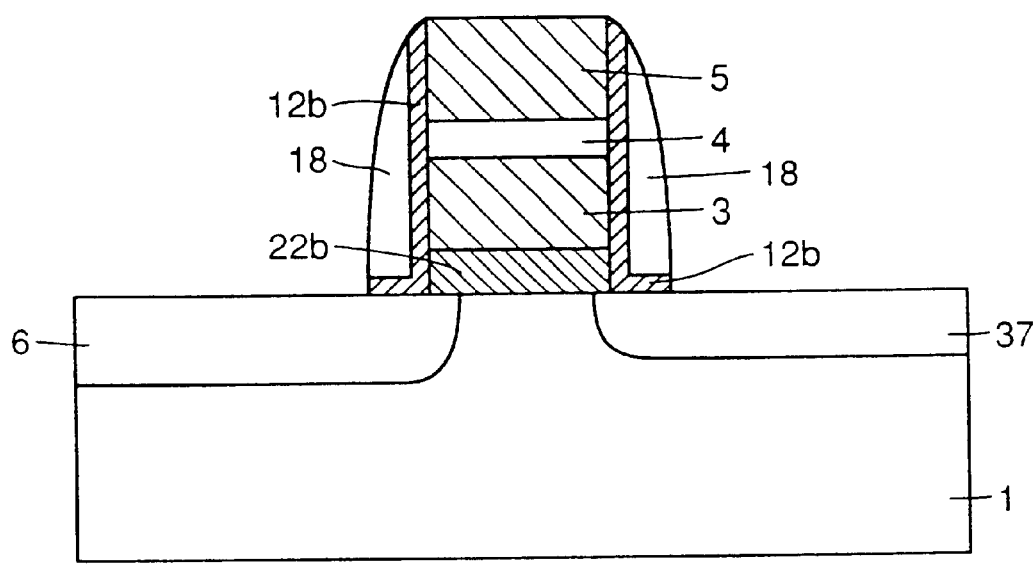

Then, as shown in FIG. 30, a silicon oxide film having a thickness of about 50 to 200 nm is formed on the whole surface by the CVD method. Anisotropic etching is effected on the whole surface of the silicon oxide film 18a to form the side wall insulating films 18 as shown in FIG. 31. This etching removes the RNO film 12b located on the source and drain regions 6 and 37.

Figure 32:
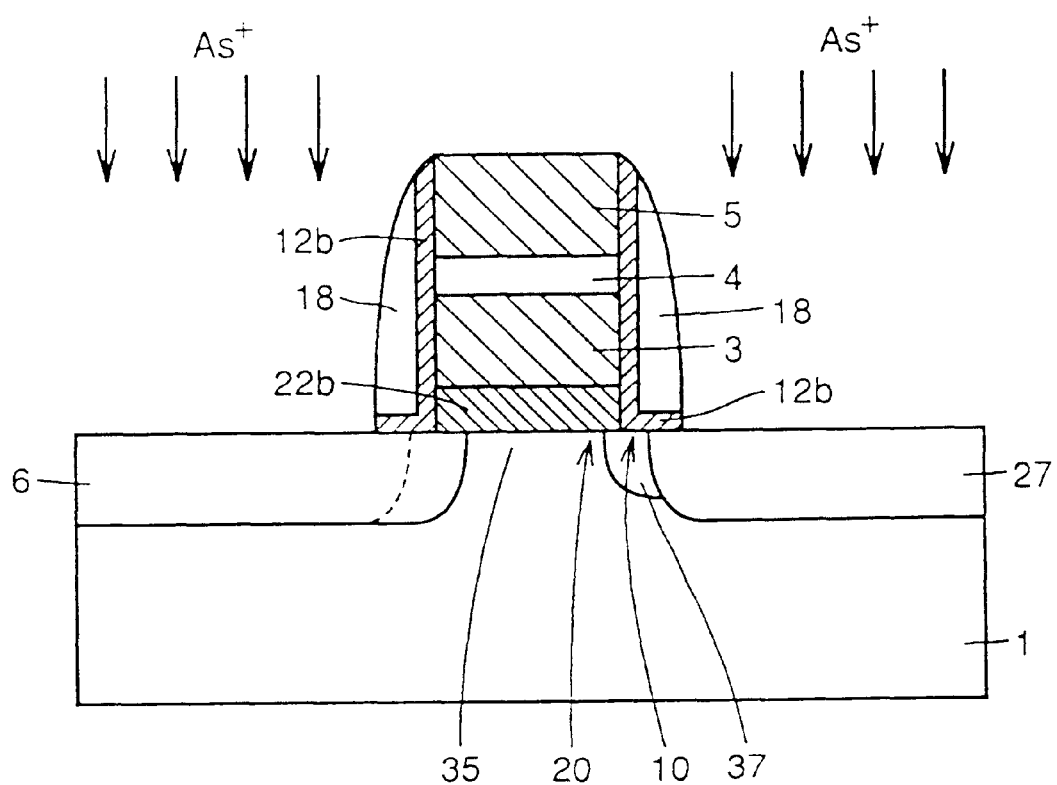

Finally, as shown in FIG. 32, the side wall insulating films 18 and control gate electrode 5 are used as a mask, and N-type impurity such as arsenic is ion-implanted at a concentration of $1\times10^{15}/cm^2$ or more into the P-type semiconductor substrate 1. Thereby, the heavily doped drain region 27 is formed. Although the ion implantation is effected on the source region 6 again, no problem is caused in connection with characteristics of elements. In this manner, the flash EEPROM of the sixth embodiment shown in FIG. 20 is completed.

The ion implanting step shown in FIGS. 28 and 29 may be executed before formation of the NO film 42 shown in FIG. 26 or before formation of the RNO film 12b shown in FIG. 27. Ion implantation for forming the heavily doped drain region 27 shown in FIG. 32 may be performed by the oblique ion implantation method. Further, the ion implanting steps shown in FIGS. 28 and 29 may be executed at the same time, in which case the impurity concentrations are set equal to that of the lightly doped drain region 37 shown in FIG. 28.

Figure 33:
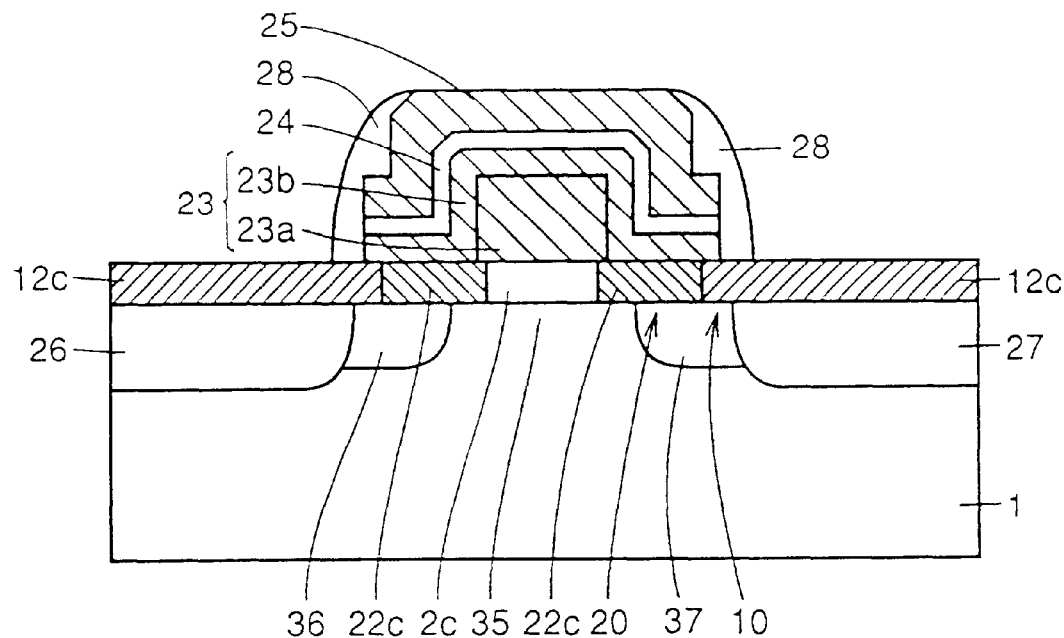
FIG. 33 is a cross section showing a flash EEPROM of a seventh embodiment of the invention.

Referring to FIG. 33, a flash EEPROM of a seventh embodiment is provided with a heavily doped source region 26 and the heavily doped drain region 27 which are formed on the main surface of the P-type semiconductor substrate 1 with a predetermined space between each other and are located at opposite sides of the channel region 35. A lightly doped source region 36 and the lightly doped drain region 37 are formed at sides of the heavily doped source region 26 and heavily doped drain region 27 near the channel region 35, respectively. Thereby, the source region and drain region of the LDD structure are formed.

RNO films 12c are formed on the heavily doped source region 26, a predetermined region of the lightly doped source region 36, the heavily doped drain region 27 and a predetermined region of the lightly doped drain region 37. NO films 22c continuous to the RNO films 12c are formed on the lightly doped source region 36 and lightly doped drain region 37. A silicon oxide film 2c located between the NO films 22c is formed on the channel region 35. The silicon oxide film 2c, NO films 22c and RNO films 12c each have a thickness of about 10 nm.

A first polysilicon film 23a having a thickness of about 30 to about 200 nm and containing a large amount of impurity introduced thereinto is formed on the silicon oxide film 2c. The first polysilicon film 23a is covered with a second polysilicon film 23b containing a large amount of impurity and having a thickness of about 50 nm. The first polysilicon film 23a and second polysilicon film 23b form a floating gate 23. On the second polysilicon film 23b is formed an interlayer insulating film 24, which is made of a silicon oxide film, a silicon nitride film or a multilayer film made of a silicon oxide film and a silicon nitride film. The interlayer insulating film 24 has a thickness which establishes a relationship that a capacity per unit area thereof is equal to a capacity per unit area of a silicon oxide film having a thickness of 20 nm.

On the interlayer insulating film 24 is formed the polysilicon film 25 having a thickness of about 100 to about 200 nm and containing a large amount of impurity introduced thereinto. There are formed side wall insulating films 28 which cover opposite side walls of the second polysilicon film 23b, interlayer insulating film 24 and polysilicon film 25.

Also in this seventh embodiment, the NO films 22c containing hydrogen at a relatively high concentration of $3\times10^{20}/cm^3$ or more is formed on the channel hot electron (hole) injection region 20. This improves the efficiency of injection of channel hot electrons during the data writing operation. As a result, the writing efficiency can be improved with a low supply voltage without requiring a high gate voltage and a high drain voltage which are required in the prior art. The RNO film 12c of the low hydrogen concentration less than $3\times10^{20}/cm^3$ is formed on the drain avalanche hot carrier injection region. This can suppress injection of drain avalanche hot carriers during the data writing operation. As a result, generation of the interface level due to drain avalanche hot carrier injection can be effectively prevented, resulting in improvement of reliability of elements.

Referring to FIGS. 34–43, a process of manufacturing the flash EEPROM of the seventh embodiment will be described below.

Figure 34:
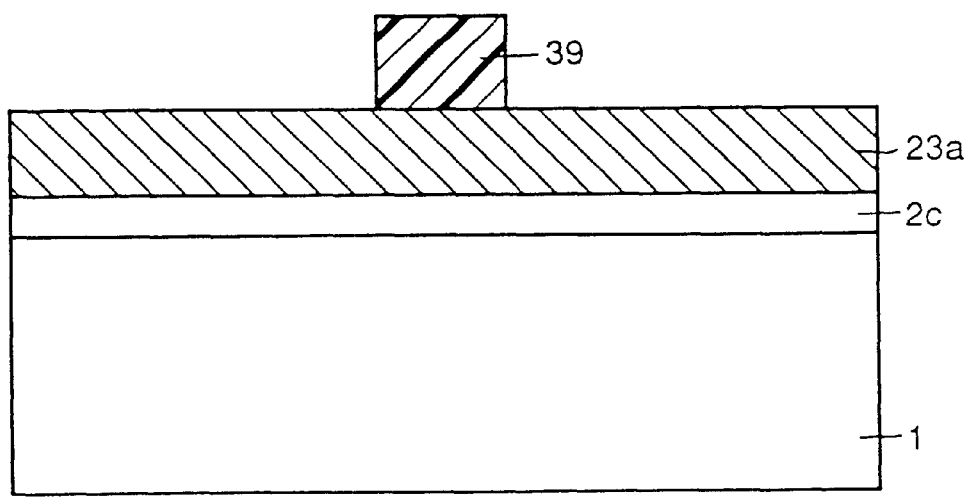
FIGS. 34–43 are cross sections showing 1st to 10th steps in a process of manufacturing the flash EEPROM of the seventh embodiment shown in FIG. 33, respectively.
Figure 35:
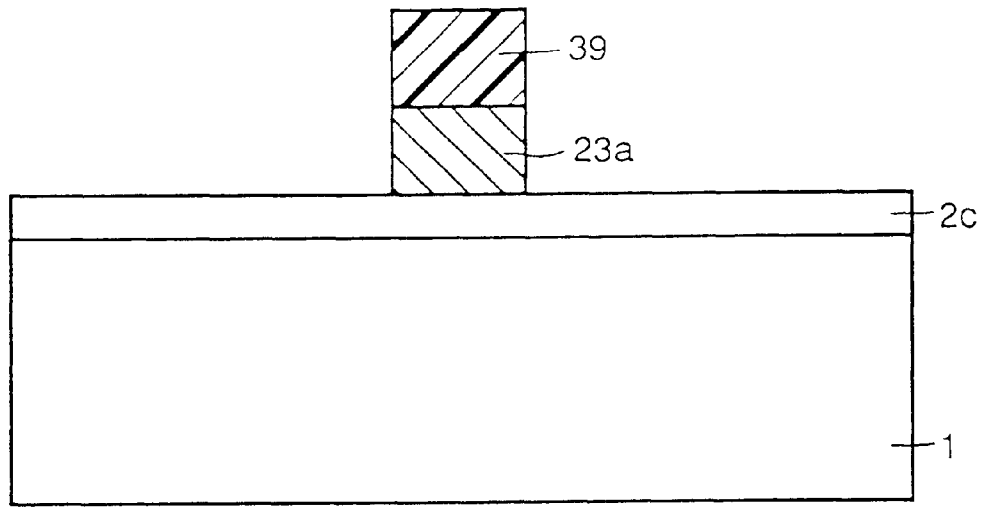

Referring first to FIG. 34, the silicon oxide film 2c of about 10 nm in thickness is formed on the P-type semiconductor substrate 1. The first polysilicon film 23a having a thickness of about 30 to 200 nm and containing a large amount of impurity introduced thereinto is formed on the silicon oxide film 2c. A photoresist 39 is formed at a predetermined region on the first polysilicon film 23a. Using the photoresist 39 as a mask, anisotropic etching is effected on the first polysilicon film 23a to form the first polysilicon film 23a having a configuration shown in FIG. 35. Thereafter, the photoresist 39 is removed.

Figure 36:
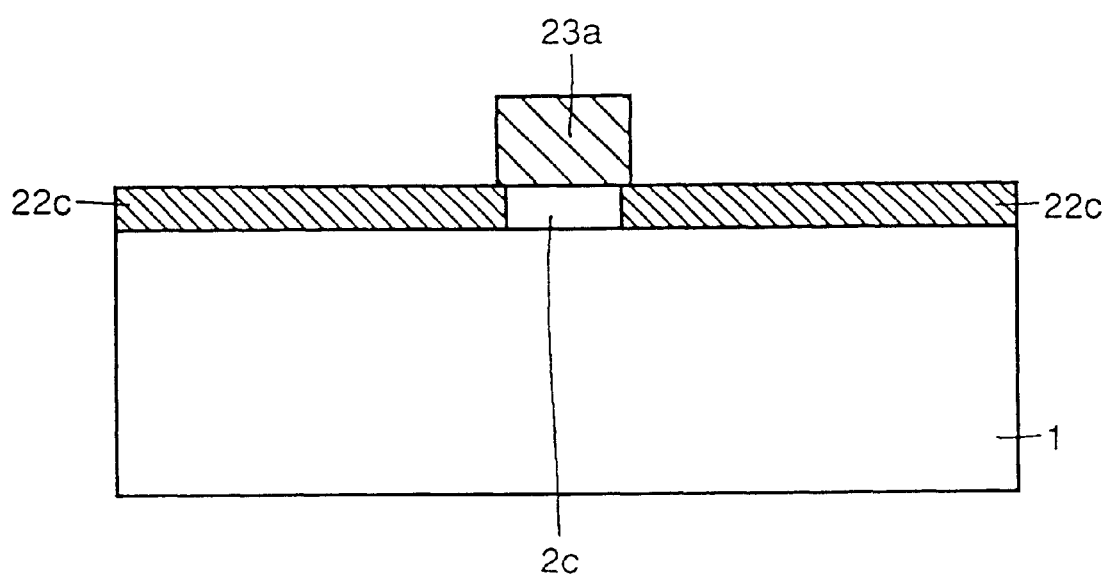

Then, using the first polysilicon film 23a as a mask, the silicon oxide film 2c is nitrided to form the NO films 22c containing hydrogen at a relatively high concentration of $3\times10^{20}/cm^3$ or more as shown in FIG. 36. This nitriding is effected by exposing the silicon oxide film 2c to ammonia atmosphere at a temperature of 800° C. to 1100° C. for 10 to 60 seconds.

Figure 37:
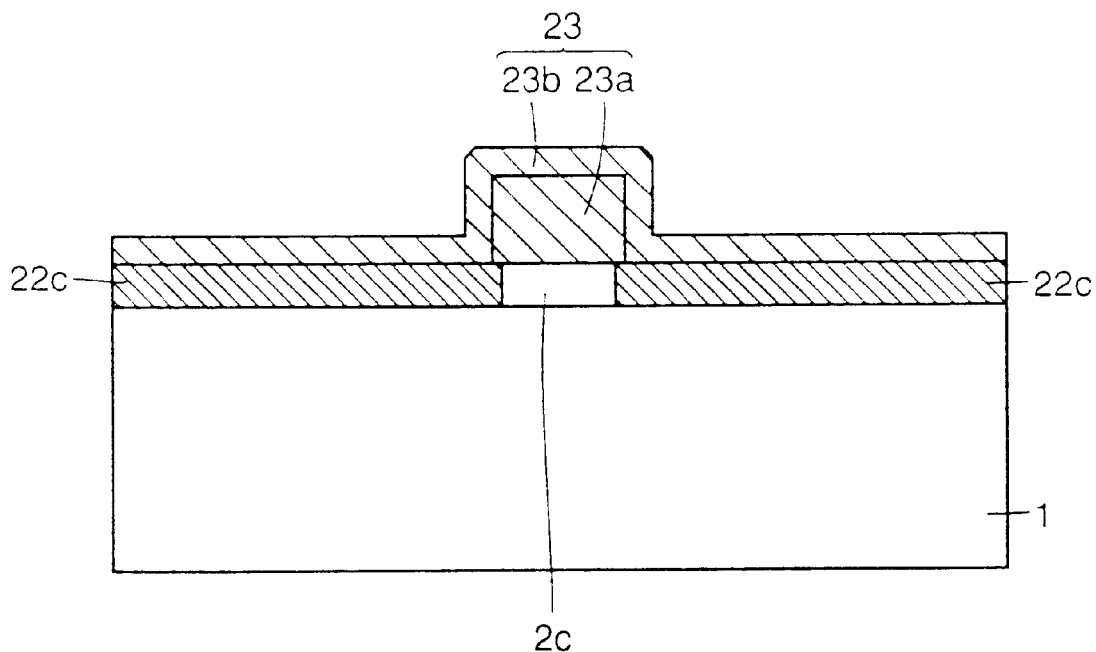

Then, as shown in FIG. 37, the CVD method is used to form on the whole surface the second polysilicon film 23b having a thickness of about 50 nm and containing a large amount of impurity introduced thereinto.

Figure 38:
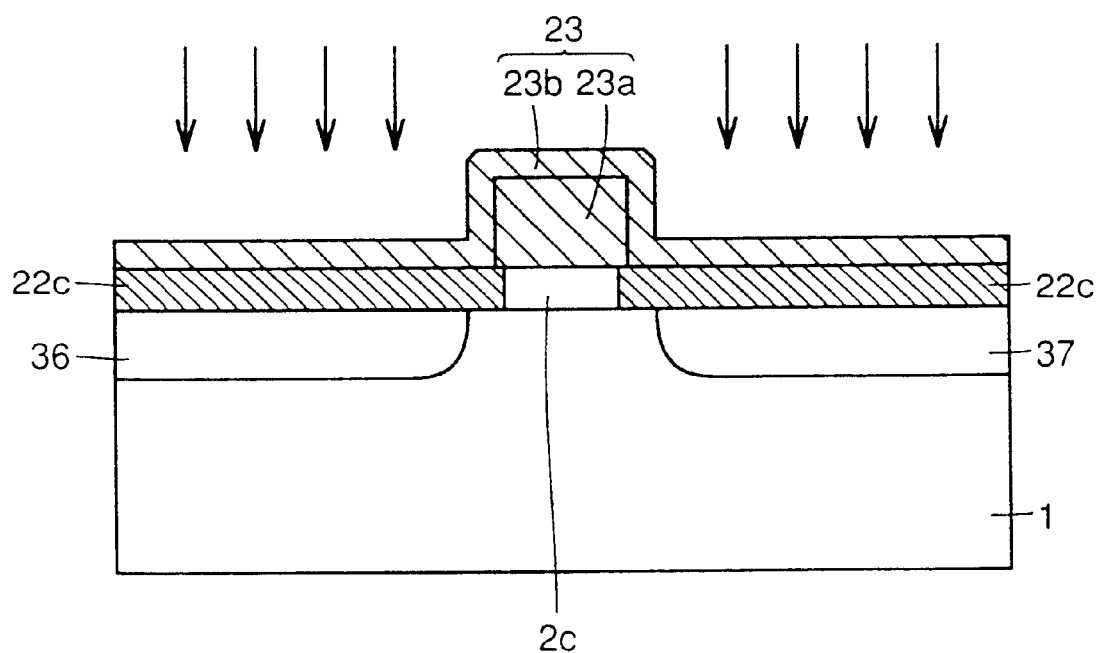

Then, as shown in FIG. 38, N-type impurity such as arsenic is ion-implanted into the P-type semiconductor substrate 1 to form the lightly doped drain region 37 and lightly doped source region 36. Only the lightly doped drain region 37 may be formed without forming the lightly doped source region 36.

Figure 39:
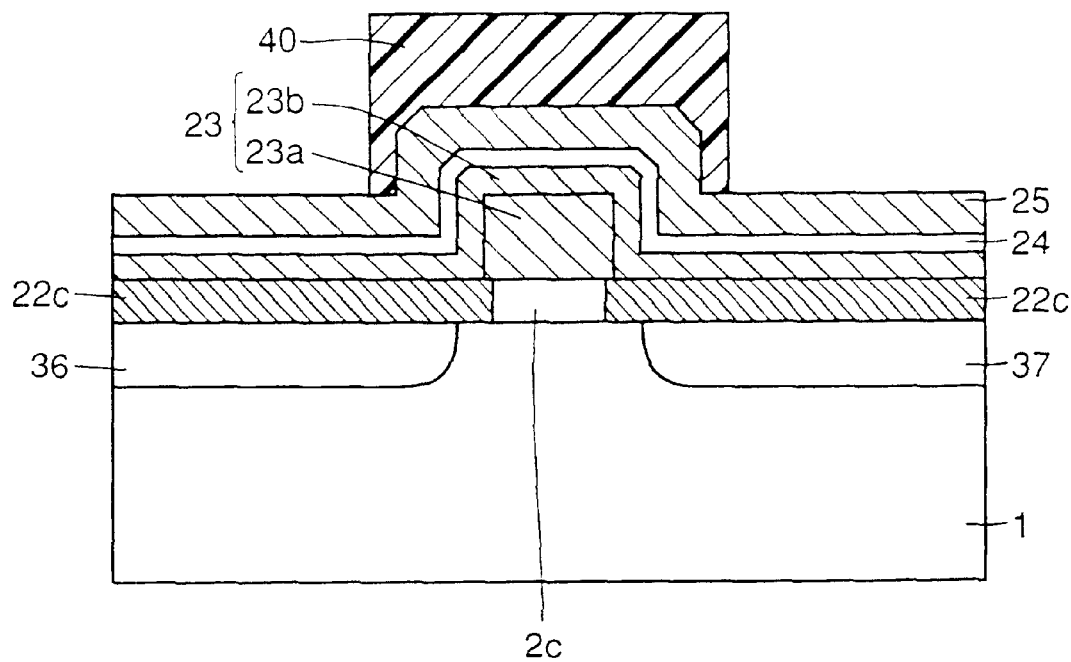

As shown in FIG. 39, the interlayer insulating film 24 made of the silicon oxide film, silicon nitride film or multilayer film formed of the silicon oxide film and silicon nitride film is formed on the second polysilicon film 23b. The polysilicon film 25 having a thickness of about 100 to 200 nm and containing a large amount of impurity introduced thereinto is formed on the interlayer insulating film 24. A photoresist 40 is formed at a predetermined region on the polysilicon film 25.

Figure 40:
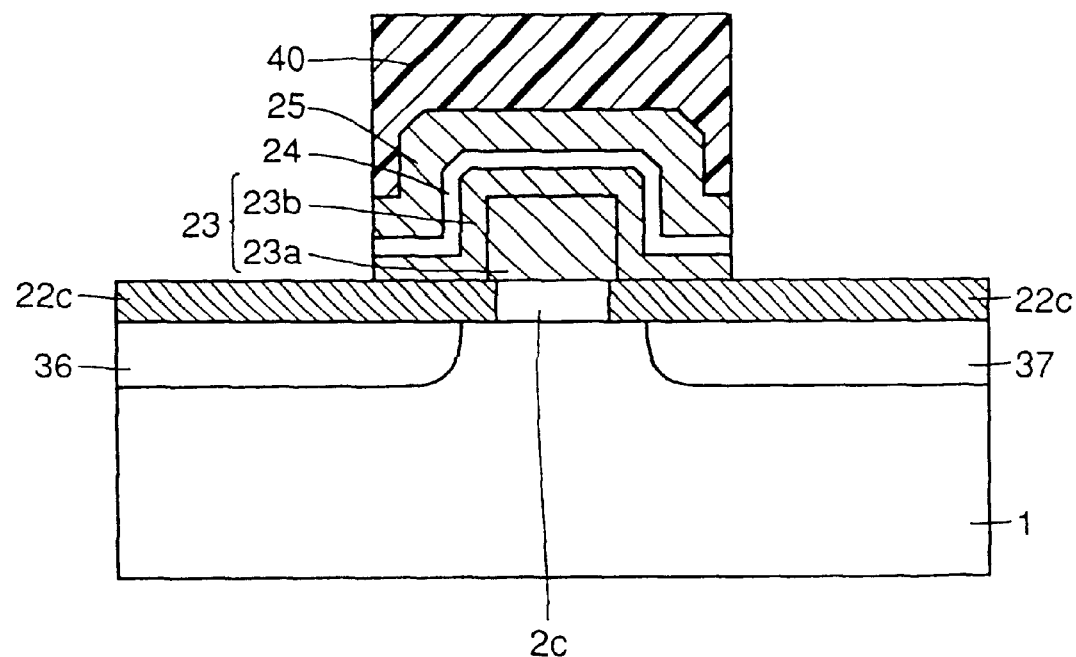

Using the photoresist 40 as a mask, anisotropic etching is effected on the polysilicon film 25, interlayer insulating film 24 and second polysilicon film 23b. Thereby, the control gate electrode 25, interlayer insulating film 24 and floating gate electrode 23 (23a and 23b) are formed as shown in FIG. 40. The control gate electrode 25 thus formed has a width of about 0.5 μm.

Figure 41:
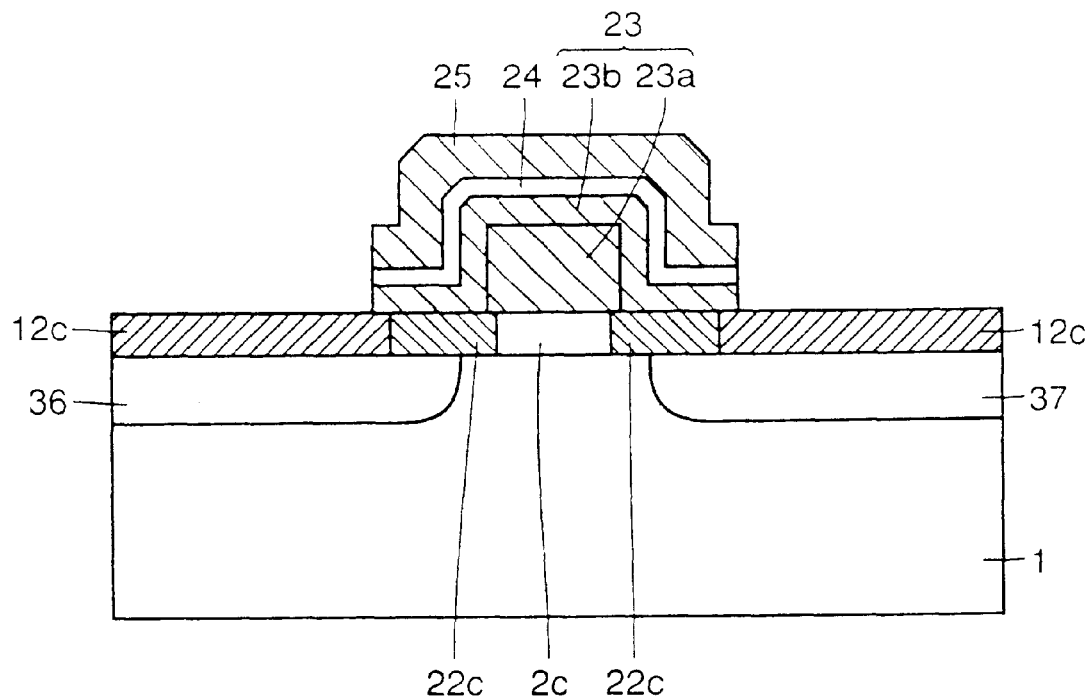

Then, annealing or oxidation is effected at a temperature of 800° C. to 1100° C. for 5 to 50 seconds. This can reduce the concentration of hydrogen at exposed regions of the NO film 22c. As a result, the RNO films 12c of the low hydrogen concentration less than $3 \times 10^{20}/cm^3$ are formed as shown in FIG. 41.

Figure 42:
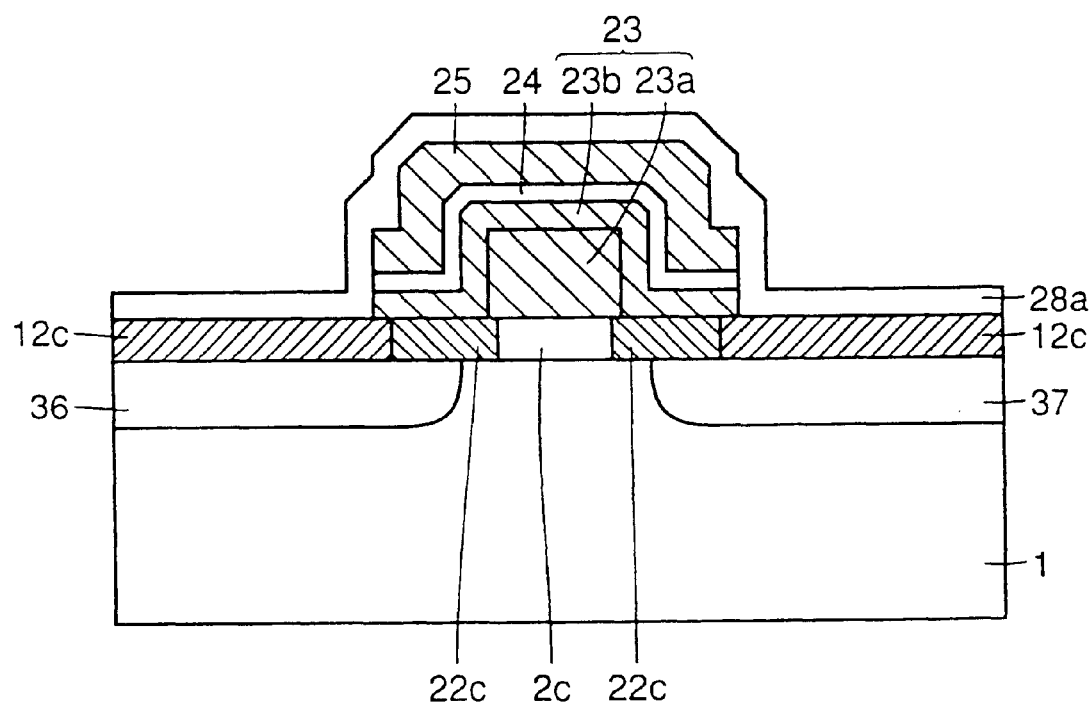
Figure 43:
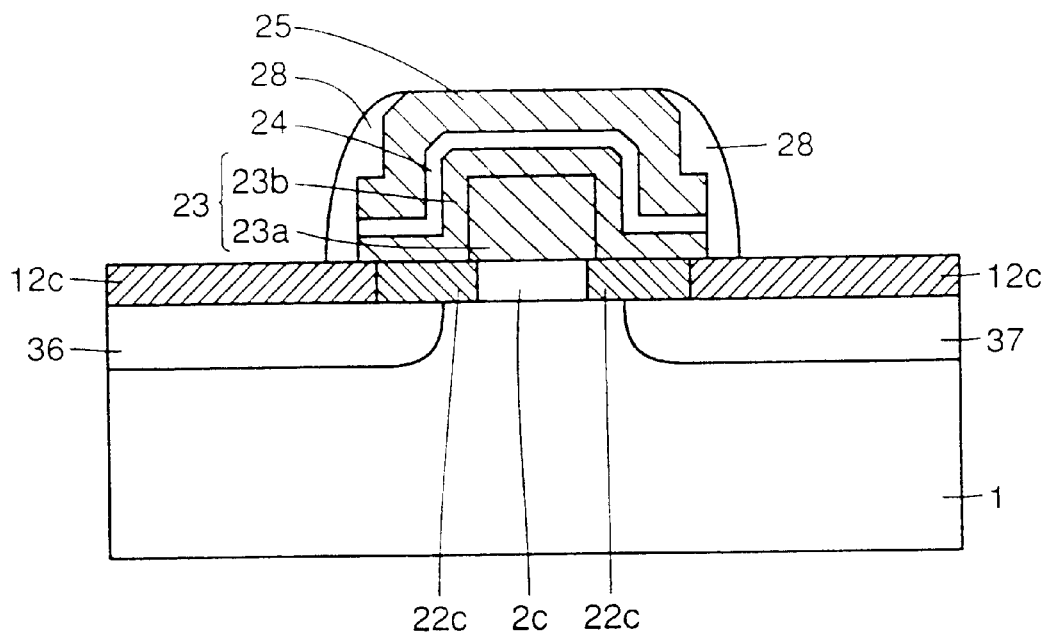

Then, as shown in FIG. 42, a silicon oxide film 28a of about 50 to 200 nm in thickness is formed on the whole surface. Anisotropic etching is effected on the silicon oxide film 28a to form the side wall insulating films 28 as shown in FIG. 43. Finally, as shown in FIG. 33, ion implantation is effected to form the heavily doped source region 26 and heavily doped drain region 27. Thereby, the flash EEPROM of the seventh embodiment is completed.

Figure 44:
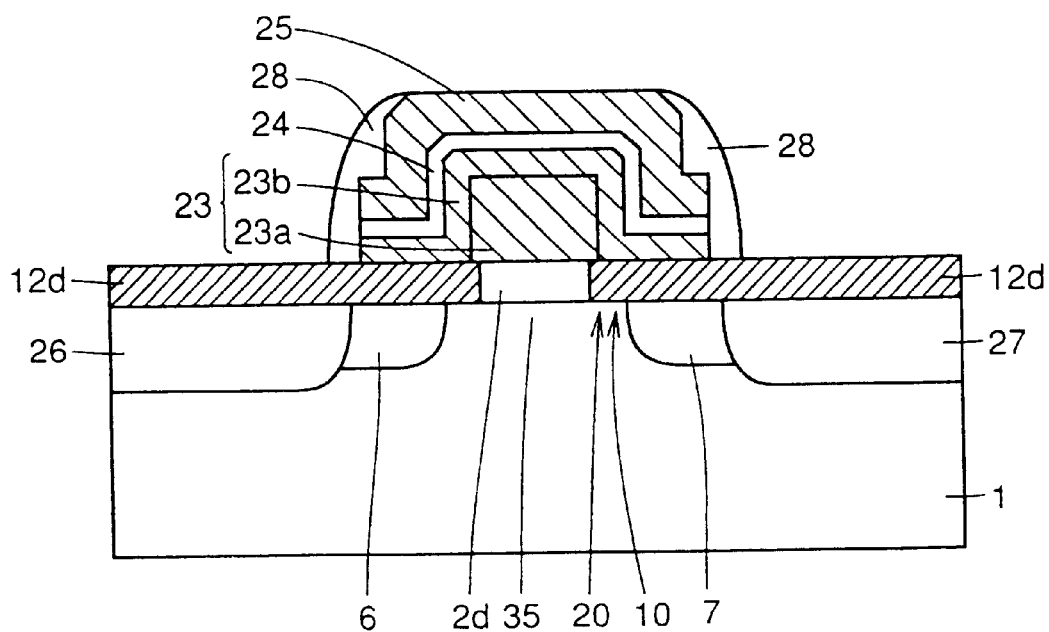
FIG. 44 is a cross section showing a flash EEPROM of an eighth embodiment of the invention.

Referring to FIG. 44, a flash EEPROM of an eighth embodiment is provided with RNO films 12d, each of which is used instead of the NO film 22c and RNO film 12c in the seventh embodiment shown in FIG. 33. A silicon oxide film 2d is formed between the RNO films 12d. The heavily doped drain region 7 is continuous to the heavily doped drain region 27. The heavily doped source region 6 is continuous to the heavily doped source region 26.

In this eighth embodiment, the RNO film 12d is formed on the channel hot electron injection region 20, so that the improved efficiency of injection of channel hot electrons is lower than those of the first to seventh embodiments described before. However, the efficiency of injection of channel hot electrons can be higher than that in the prior art in which a silicon oxide film is formed on the channel hot electron injection region 20. The RNO film 12d of the eighth embodiment can be produced easily by effecting anneal or oxidation immediately after the nitriding step in the seventh embodiment.

Figure 45:
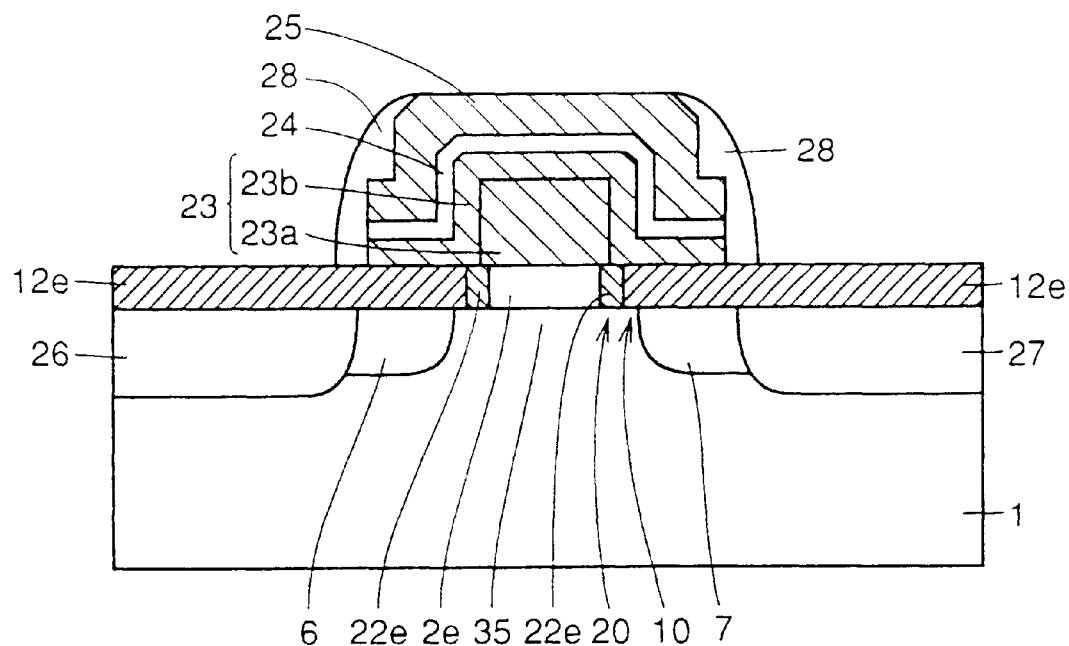
FIG. 45 is a cross section showing a flash EEPROM of a ninth embodiment of the invention.

Referring to FIG. 45, a flash EEPROM of a ninth embodiment differs from the seventh embodiment shown in FIG. 33 in that NO films 22e are narrow and RNO films 12e are extended up to positions above the channel region 35. A silicon oxide film 2e is formed on the channel region 35 and is located between the NO films 22e.

The heavily doped drain region 7 is continuous to the heavily doped drain region 27. The heavily doped source region 6 is continuous to the heavily doped source region 26. This ninth embodiment employs combination of the heavily doped drain regions 7 and 27, and hence does not employ an ordinary LDD structure. Therefore, the drain avalanche hot carrier injection region 10 is located outside the heavily doped drain region 7. In this ninth embodiment, the RNO film 12e is formed on the drain avalanche hot carrier injection region 10, and the NO film 22e is formed on the channel hot electron injection region 20. Therefore, similarly to the first to seventh embodiments, the efficiency of injection of channel hot electrons can be improved while suppressing injection of drain avalanche hot carriers. The RNO film 12e can be produced easily by effecting strong annealing or oxidation using a process similar to the nitriding step of the seventh embodiment shown in FIG. 41.

Figure 46:
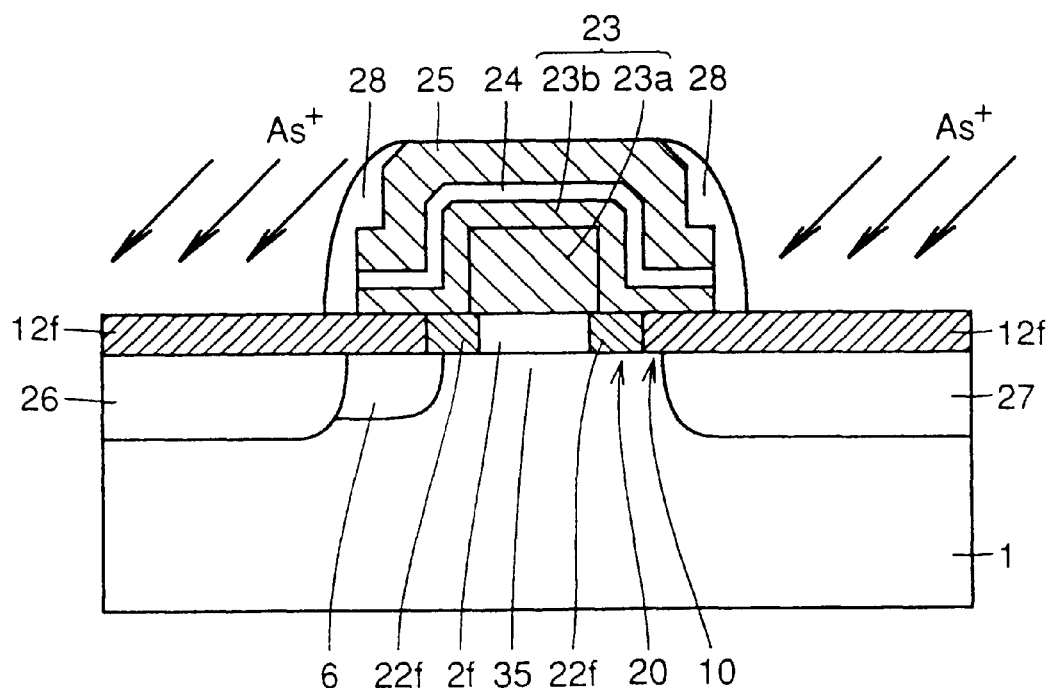
FIG. 46 is a cross section showing a flash EEPROM of a tenth embodiment of the invention.

Referring to FIG. 46, a flash EEPROM of a tenth embodiment is provided with the heavily doped source region 26 and the heavily doped drain region 27 which are formed on the main surface of the P-type semiconductor substrate 1 with a predetermined space between each other and are located at opposite sides of the channel region 35. The heavily doped source region 6 is continuous to the heavily doped source region 26. A silicon oxide film 2f of about 10 nm in thickness is formed on a central portion of the channel region 35. NO films 22f are formed at opposite sides of the silicon oxide film 2f. RNO films 12f are formed with the NO films 22f therebetween.

Thus, the RNO film 12f is formed on the drain avalanche hot carrier injection region 10, and the NO film 22f is formed on the channel hot electron injection region 20. The heavily doped drain region 27 in this tenth embodiment is formed by the oblique ion implantation. This enables easy adjustment of a positional relationship between the drain region 27 and RNO film 12f.

In the seventh to tenth embodiments described above, since the interlayer insulating film 24 has a surface area larger than those of the insulating films (2c, 2d, 2e, 2f, 12c, 12d, 12e, 12f, 22c, 22e, 22f) under the floating gate electrode 23, the capacity of the interlayer insulating film 24 is larger than those of the insulating films under the floating gate electrode 23. This results in such an advantage that the voltage applied to the control gate electrode 25 can be reduced.

Figure 47:
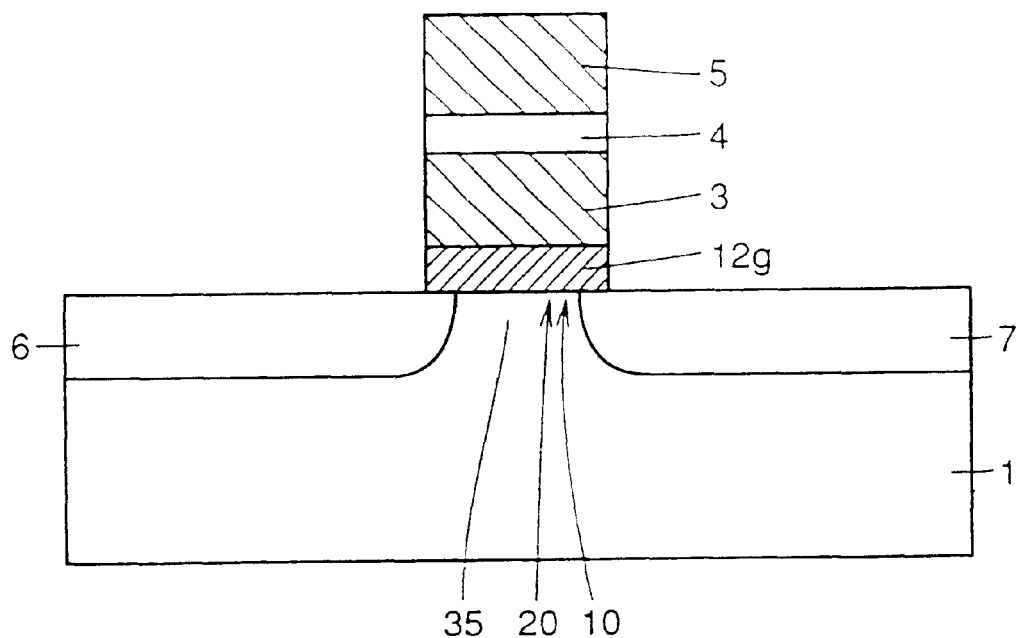
FIG. 47 is a cross section showing a flash EEPROM of an eleventh embodiment of the invention.

Referring to FIG. 47, a flash EEPROM of an eleventh embodiment is provided with the source region 6 and drain region 7 which are formed on the main surface of the P-type semiconductor substrate 1 with a predetermined space between each other and are located at opposite sides of the channel region 35. Only an RNO film 12g of about 10 nm in thickness is formed on the channel region 35. On the RNO film 12g is formed the floating gate electrode 3 made of a polysilicon film which has a thickness of about 50 to about 100 nm and contains a large amount of impurity introduced thereinto. On the floating gate electrode 3 is formed the interlayer insulating film 4 which is made of a silicon oxide film, a silicon nitride film or a multilayer film of a silicon oxide film and a silicon nitride film. The interlayer insulating film 4 has a thickness establishing a relationship that a capacity per unit area thereof is equal to a capacity per unit area of a silicon oxide film of 20 nm in thickness. On the interlayer insulating film 4 is formed the control gate electrode 5 made of a polysilicon film which has a thickness of about 100 to about 200 nm and contains a large amount of impurity introduced thereinto.

In this eleventh embodiment, the RNO film 12g containing nitrogen at a concentration of $2.5 \times 10^{20}/cm^3$ or more and hydrogen at a concentration less than $3 \times 10^{20}/cm^3$ is formed on both the drain avalanche hot carrier injection region 10 and channel hot electron injection region 20. Thereby, the efficiency of injection of channel hot electrons can be improved to some extent while effectively suppressing injection of drain avalanche hot carriers. Since the injection of drain avalanche hot carriers can be effectively suppressed as described above, the drain voltage can be increased, in which case the writing efficiency can be further improved.

Referring to FIGS. 48 to 52, a process of manufacturing the flash EEPROM of the eleventh embodiment will be described below.

Figure 48:
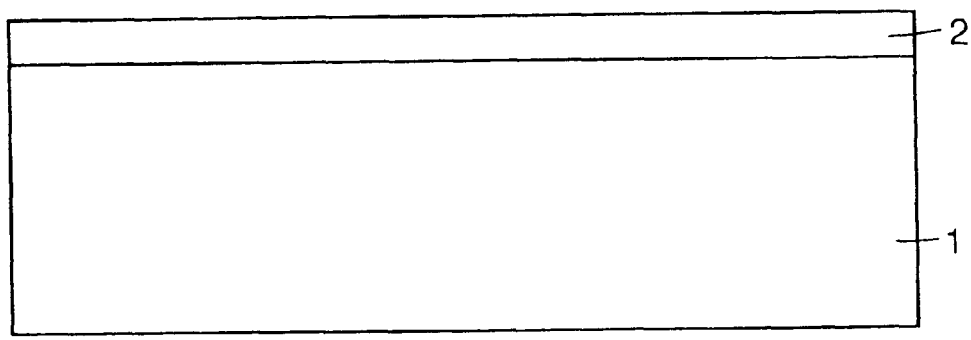
FIGS. 48–52 are cross sections showing 1st to 5th steps in a process of manufacturing the flash EEPROM of the eleventh embodiment shown in FIG. 47, respectively.
Figure 49:
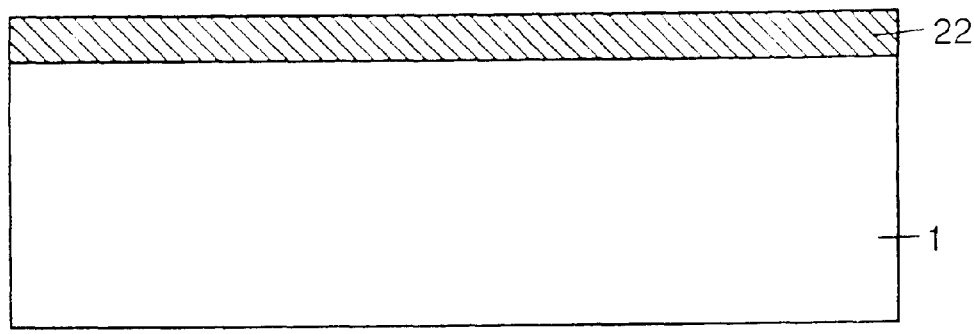

Referring first to FIG. 48, the silicon oxide film 2 having a thickness of about 10 nm is formed on the P-type semiconductor substrate 1 by oxidation or deposition. The silicon oxide film 2 is then nitrided to form the NO film 22 containing nitrogen at a concentration of $2.5 \times 10^{20}/cm^3$ or more and hydrogen at a concentration of $3 \times 10^{20}/cm^3$ or more as shown in FIG. 49.

Figure 50:
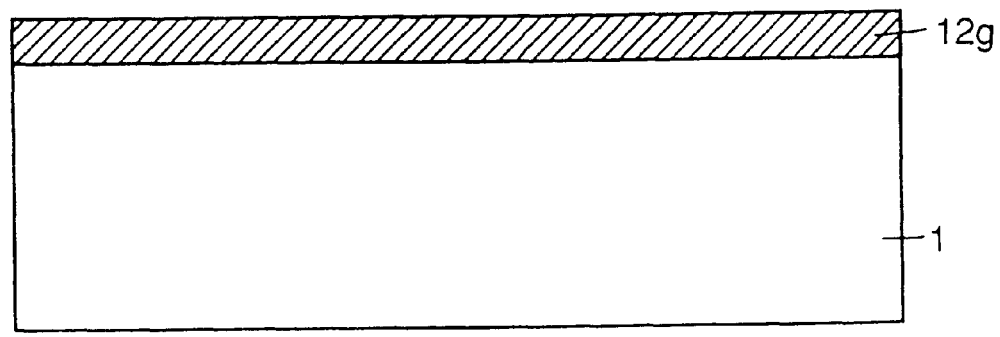
Figure 51:
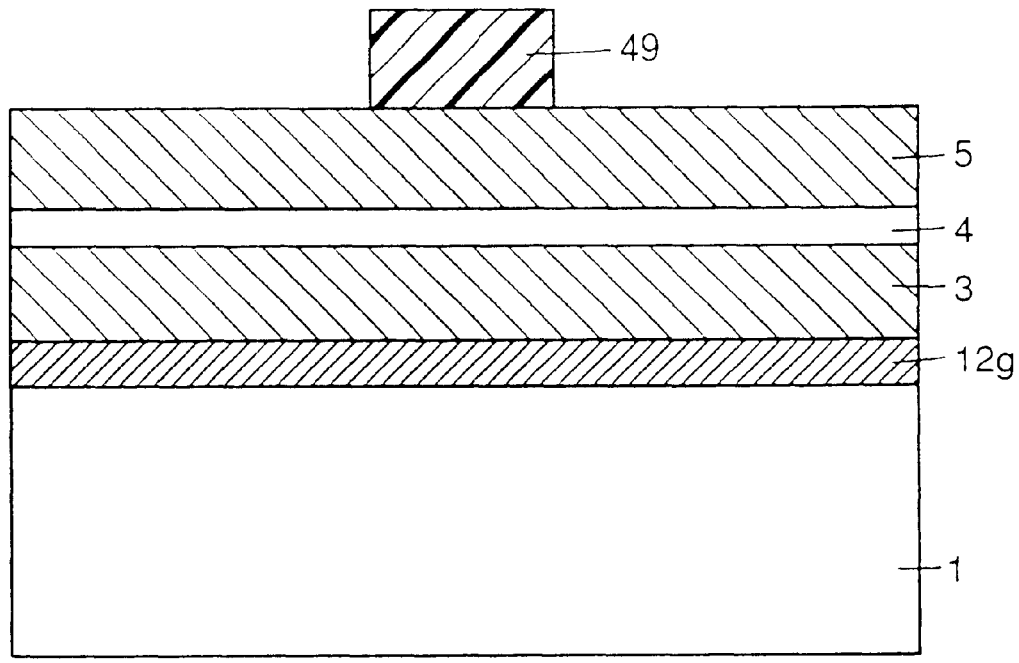

Then, annealing or oxidation is effected at a temperature of 800° C. to 1100° C. for 5 to 60 seconds to form the RNO film 12g containing nitrogen at a concentration of $2.5 \times 10^{20}/cm^3$ or more and hydrogen at a concentration less than $3 \times 10^{20}/cm^3$ as shown in FIG. 50.

Then, the CVD method is used to form on the RNO film 12g the polysilicon film 3 which has a thickness of about 50 to about 100 nm and contains a large amount of impurity introduced thereinto. The interlayer insulating film 4, which is made of the silicon oxide film, silicon nitride film or multilayer film of the silicon oxide film and silicon nitride film, is formed on the polysilicon film 3. The thickness of the interlayer insulating film 4 thus formed is determined to establish the relationship that the capacity per unit area thereof is equal to the capacity per unit area of the silicon oxide film having a thickness of about 20 nm.

Figure 52:
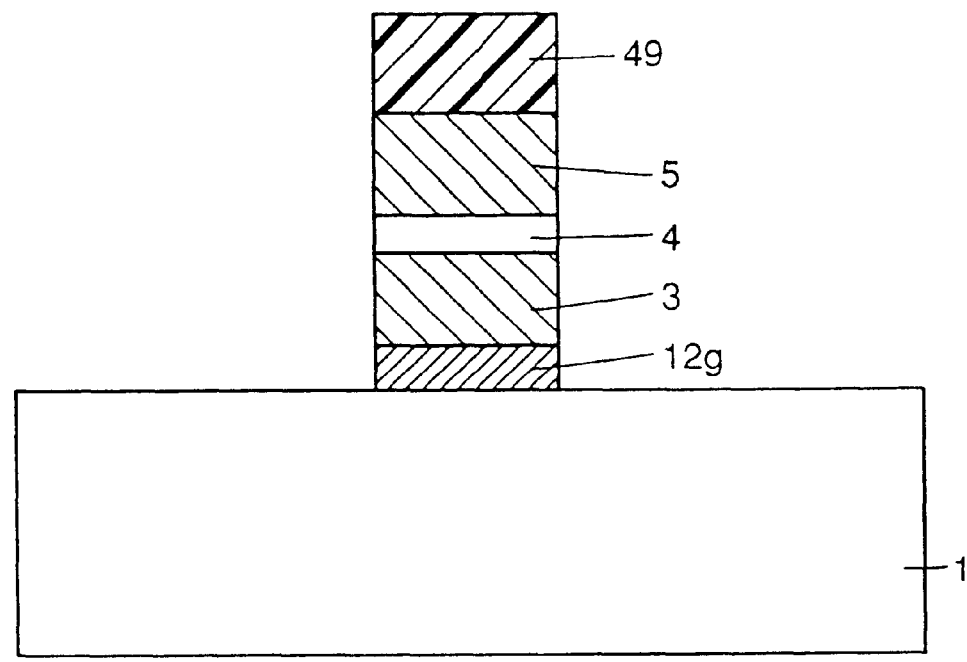
Figure 53:
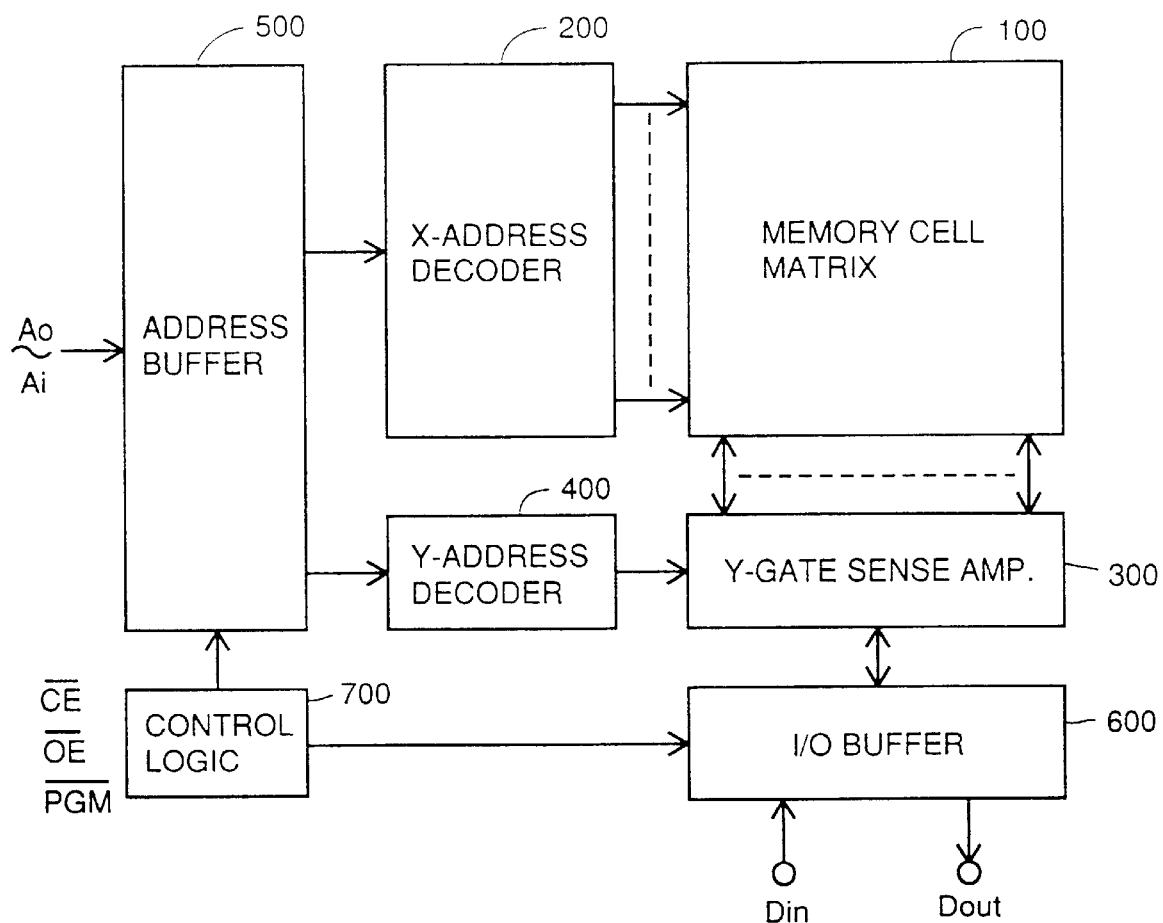
FIG. 53 is a block diagram showing a general structure of a conventional flash EEPROM.
Figure 54:
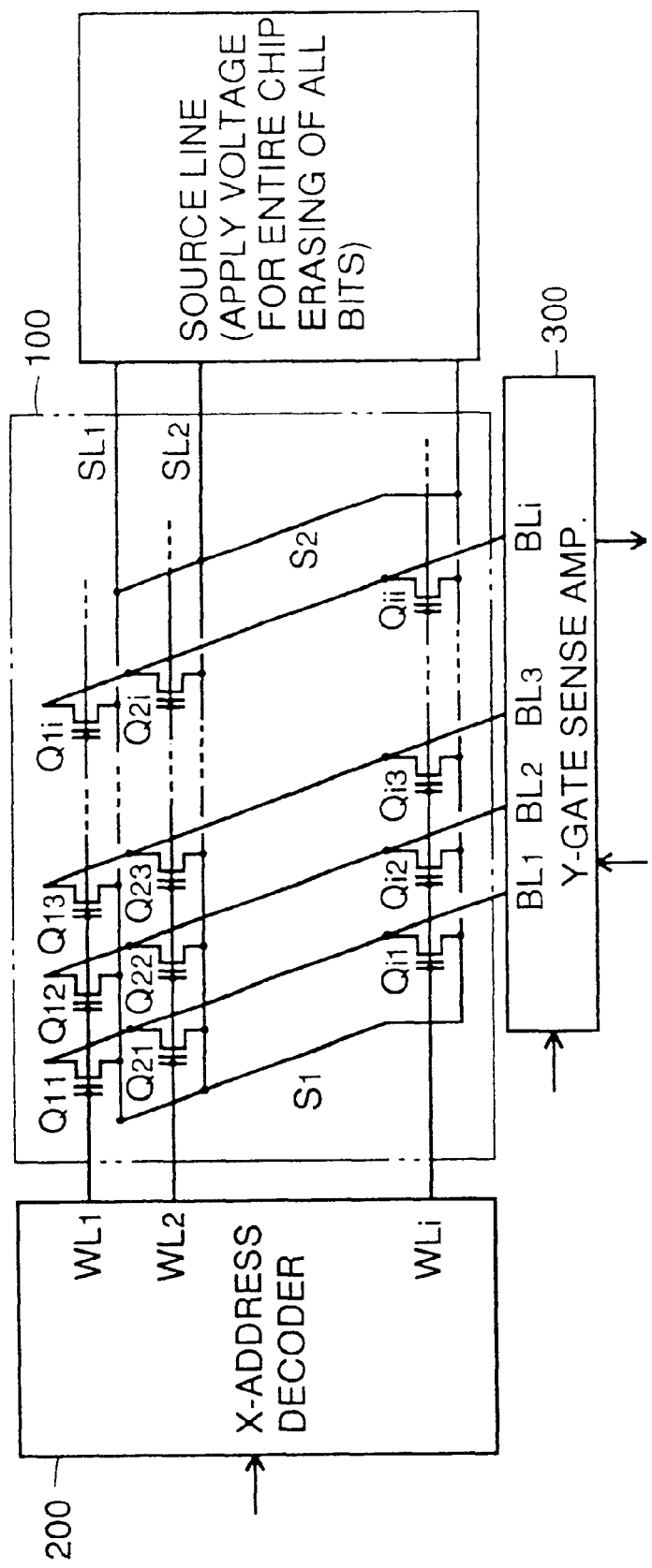
FIG. 54 is an equivalent circuit diagram showing a schematic structure of a memory cell matrix 100 shown in FIG. 53.
Figure 55:
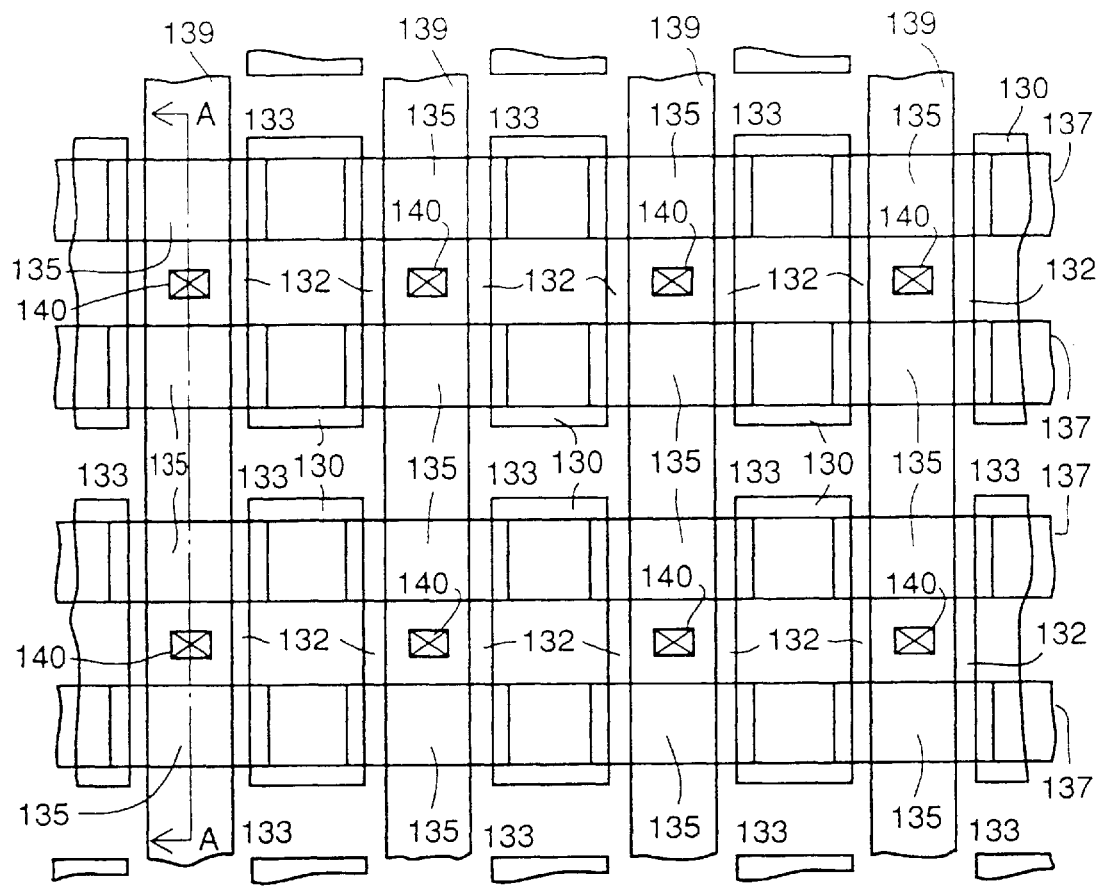
FIG. 55 is a schematic plan showing a conventional flash EEPROM of a stack gate type.
Figure 56:
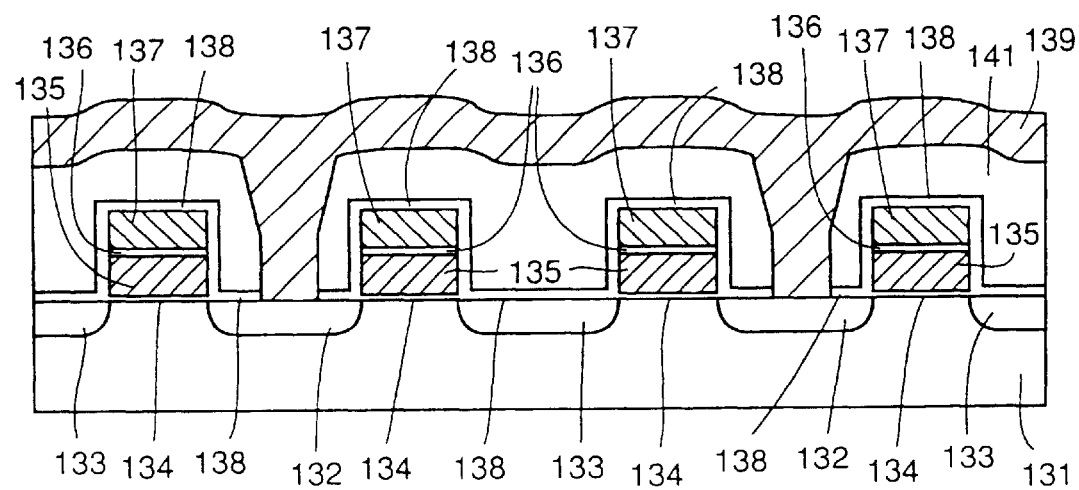
FIG. 56 is a cross section taken along line A—A in FIG. 55.
Figure 57:
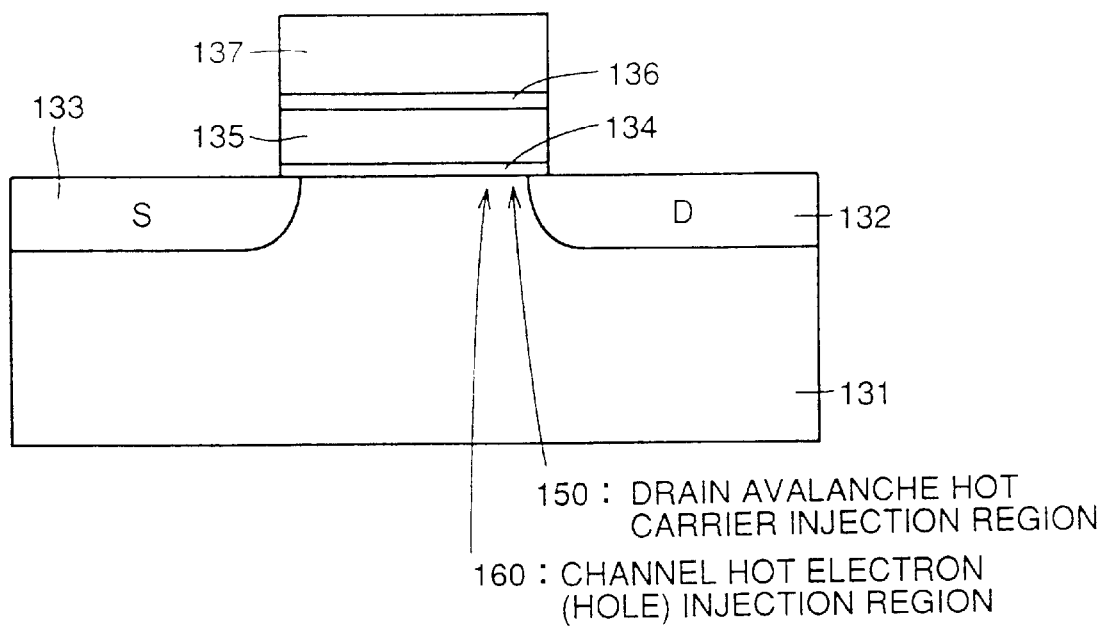
FIG. 57 is a cross section for showing a write operation of a conventional flash EEPROM.
Figure 58:
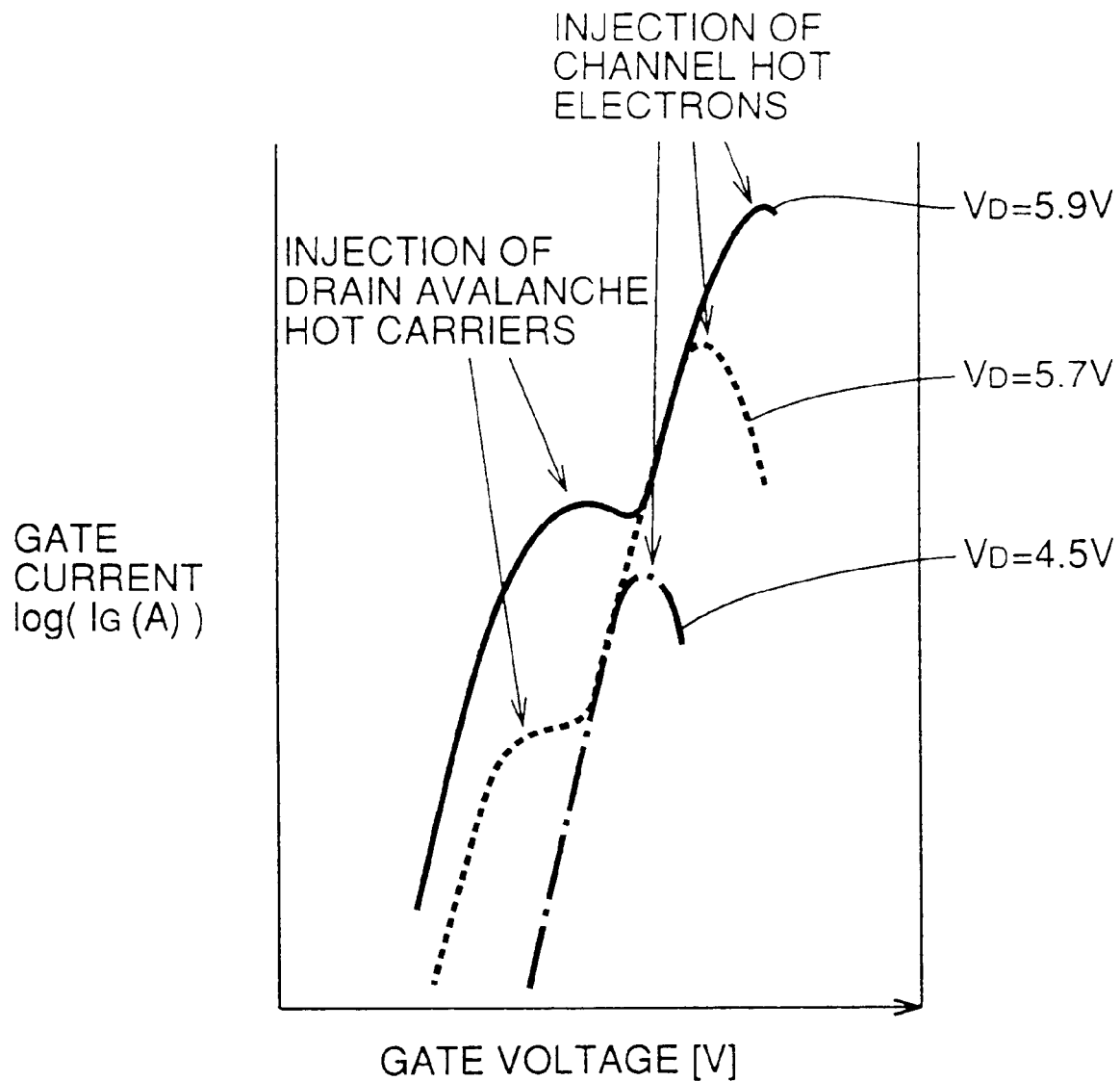
FIG. 58 shows correlation between a gate voltage and a gate current during a write operation of the conventional flash EEPROM.
Figure 59:
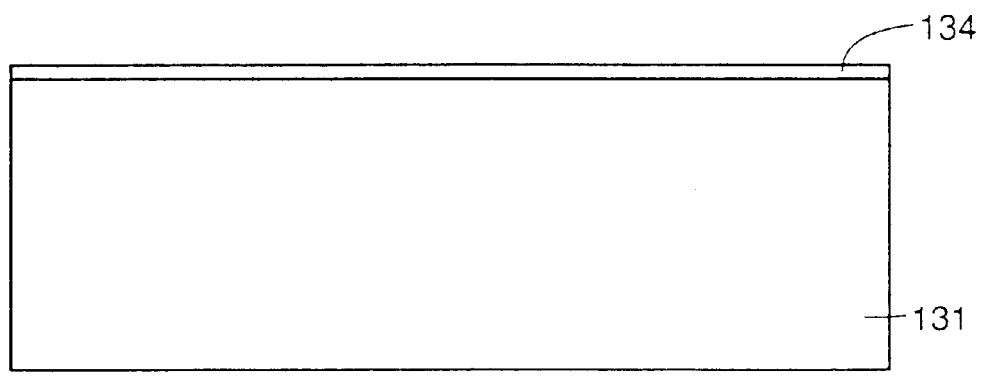
FIGS. 59–61 are cross sections showing 1st to 3rd steps in a process of manufacturing the conventional flash EEPROM shown in FIG. 57.
Figure 60:
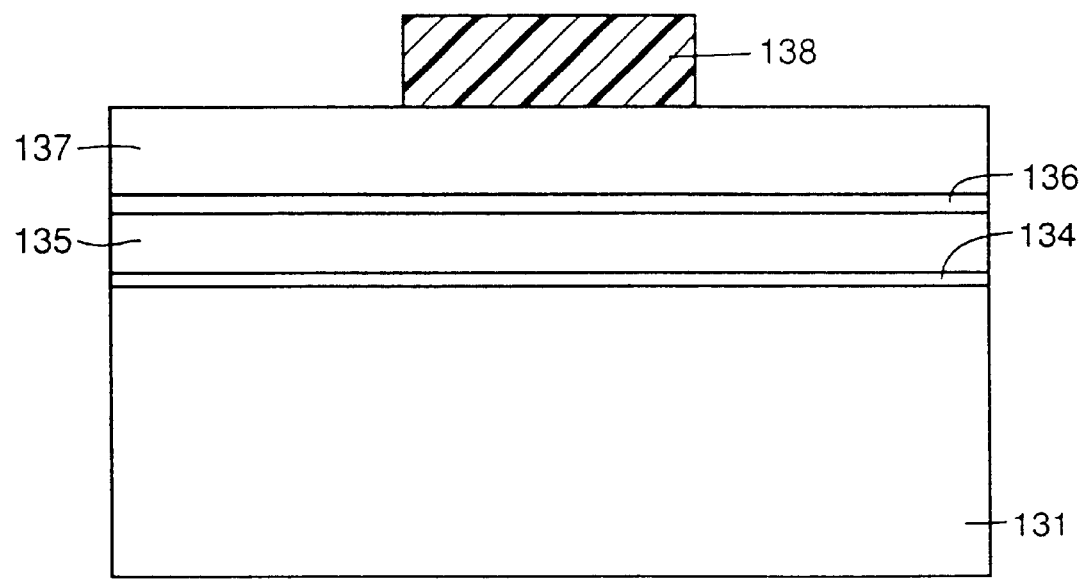
Figure 61:
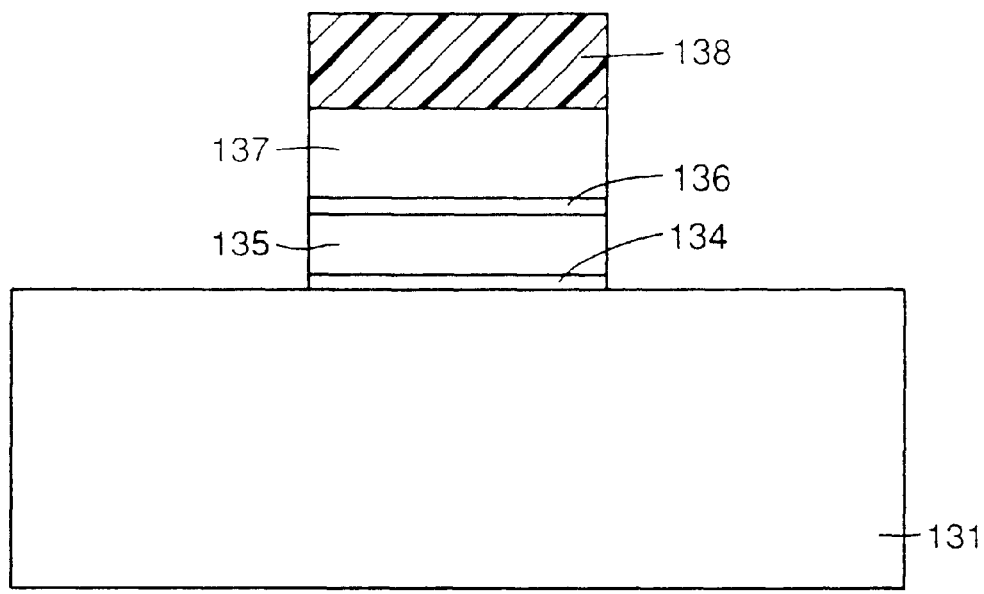

The CVD method is used to form on the interlayer insulating film 4 the polysilicon film 5 which has a thickness of about 100 to 200 nm and contains a large amount of impurity introduced thereinto. A photoresist 49 is formed at a predetermined region of the polysilicon film 5. Using the photoresist 49 as a mask, anisotropic etching is effected on the polysilicon film 5, interlayer insulating film 4, polysilicon film 3 and RNO film 12g. Thereby, the control gate electrode 5, interlayer insulating film 4, floating gate electrode 3 and RNO film 12g are completed as shown in FIG. 52. Thereafter, the photoresist 49 is removed.

Finally, ion implantation is effected to form the source and drain regions 6 and 7 shown in FIG. 47. The ion implantation may be effected by an ordinary ion implantation method or by oblique ion implantation method. The drain region may be formed after forming side wall insulating films (not show) on side walls of the floating gate electrode 3, interlayer insulating film 4 and control gate electrode 5.

According to the semiconductor memory device of one aspect of the invention, injection of drain avalanche hot carriers can be effectively suppressed by forming the first nitrided oxide film containing a first content of hydrogen in the drain avalanche hot carrier injection region. Thereby, generation of the interface level due to injection of drain avalanche hot carriers can be prevented. Also the efficiency of injection of channel hot carriers can be improved by forming a second nitrided oxide film containing a second content of hydrogen larger than the first content. Thereby, the writing efficiency can be improved without increasing the gate voltage and drain voltage.

According to the semiconductor memory device of another aspect of the invention, a nitrided oxide film containing nitrogen at a concentration of $2.5 \times 10^{20}/cm^3$ or more and hydrogen at a concentration less than $3 \times 10^{20}/cm^3$ is formed at the drain avalanche hot carrier injection region, whereby the injection of drain avalanche hot carriers is suppressed. Thereby, generation of the interface level, which may be caused by injection of drain avalanche hot carriers, can be effectively suppressed even if elements are miniaturized to a higher extent.

According to the method of manufacturing the semiconductor memory device of an aspect of the invention, a first nitrided oxide film containing a first content of hydrogen is formed at the drain avalanche hot carrier injection region on the main surface of the semiconductor substrate, and a second nitrided oxide film containing a second content of hydrogen larger than the first content is formed at the channel hot carrier injection region on the main surface of the semiconductor substrate. Thereby, such a semiconductor memory device can be manufactured easily that can improve the efficiency of injection of channel hot carriers while suppressing injection of drain avalanche hot carriers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device contacting at least one transistor, wherein a single transistor comprises:

a semiconductor substrate having a main surface;

a source region and a drain region which are formed on said main surface of said semiconductor substrate with a predetermined space between each other and are located at opposite sides of a channel region;

an oxide film formed on said main surface of said semiconductor substrate, and containing a content of hydrogen; and a gate electrode formed on said channel region, wherein said content of hydrogen is larger on a region from said drain region near said channel region to said source region near said channel region than on a region between said drain region and said channel region.

2. A semiconductor memory device contacting at least one transistor, wherein a single transistor comprises:

a semiconductor substrate having at main surface;

a source region and a drain region which are formed on said main surface of said semiconductor substrate with a predetermined space between each other and are located at opposite sides of a channel region;

an oxide film formed on said main surface of said semiconductor substrate, and containing a content of nitrogen; and a gate electrode formed on said channel region, wherein said content of nitrogen is larger on a region from said drain region near said channel region to said source region near said channel region than on a region between said drain region and said channel region.

3. A semiconductor memory device contacting at least one transistor, wherein a single transistor comprises:

a semiconductor substrate having a main surface;

a source region and a drain region which are formed on said main surface of said semiconductor substrate with a predetermined space between each other and are located at opposite sides of a channel region;

an oxide film formed on said main surface of said semiconductor substrate, and containing a content of hydrogen; and a gate electrode formed on said channel region, wherein said oxide film contains nitrogen at not less than $2.5 \times 10^{20}/ cm^3$, and said content of hydrogen is less than $3 \times 10^{20}/ cm^3$.

* * * * *